(12) United States Patent
Kim et al.

(10) Patent No.: US 8,546,258 B2
(45) Date of Patent: Oct. 1, 2013

(54) METHOD OF FABRICATING METAL CONTACT USING DOUBLE PATTERNING TECHNOLOGY AND DEVICE FORMED THEREBY

(75) Inventors: Bong-cheol Kim, Seoul (KR); Dae-youp Lee, Gunpo-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/485,230

(22) Filed: May 31, 2012

(65) Prior Publication Data

US 2013/0171821 A1    Jul. 4, 2013

(30) Foreign Application Priority Data

Jun. 1, 2011 (KR) .................. 10-2011-0052993

(51) Int. Cl.
  *H01L 21/44* (2006.01)
(52) U.S. Cl.
  USPC ........... 438/675; 438/671; 438/689; 438/692; 438/696; 438/702; 257/E21.231
(58) Field of Classification Search
  None
  See application file for complete search history.

(56) References Cited

U.S. PATENT DOCUMENTS

| | | | |
|---|---|---|---|
| 7,592,271 B2 | 9/2009 | Jung | |
| 7,879,729 B2 | 2/2011 | Jung | |
| 2009/0124086 A1 | 5/2009 | Jung | |
| 2009/0170330 A1 | 7/2009 | Jung | |
| 2010/0093173 A1* | 4/2010 | Park et al. ............. | 438/689 |

FOREIGN PATENT DOCUMENTS

| | | |
|---|---|---|
| KR | 10-2009-0011901 | 2/2009 |
| KR | 10-2009-0049379 | 5/2009 |
| KR | 10-2009-0070474 | 7/2009 |
| KR | 10-2009-0127007 | 12/2009 |

* cited by examiner

*Primary Examiner* — Kyoung Lee
(74) *Attorney, Agent, or Firm* — Onello & Mello, LLP

(57) ABSTRACT

Metal contacts are formed within a string overhead area using a double patterning technology (DPT) process thereby allowing for the reduction of a string overhead area and a concomitant reduction in the chip size of a semiconductor device. A first mask pattern is formed by etching a first mask layer, the first mask pattern including a first opening formed in a cell region and a first hole formed in a peripheral region. A first sacrificial pattern is formed on the first mask pattern and the exposed first insulating layer of the cell region using a double patterning technology process. Contact holes are formed by exposing the target layer by etching the first insulating layer using the first mask pattern and the first sacrificial pattern as an etch mask. Metal contacts are then formed in the contact holes.

15 Claims, 26 Drawing Sheets

METHOD OF FABRICATING METAL CONTACT USING DOUBLE PATTERNING TECHNOLOGY AND DEVICE FORMED THEREBY

CROSS-REFERENCE TO RELATED APPLICATIONS

This application claims the benefit of Korean Patent Application No. 10-2011-0052993, filed on Jun. 1, 2011, in the Korean Intellectual Property Office, the disclosure of which is incorporated herein in its entirety by reference.

BACKGROUND

Inventive concepts relate to a method of fabricating a semiconductor device, and more particularly, to a method of forming a metal contact.

As the integration density of semiconductor devices increases, the pitch between patterns formed in semiconductor devices is reduced in kind. As the integration density increases, the resolution limit of photolithographic processes may be reached, and the area available for a metal contact may also be reduced.

SUMMARY

In exemplary embodiments in accordance with principles of inventive concepts a method of fabricating a metal contact and a semiconductor device including the metal contact, can minimize a string overhead area due to a reduction in the chip size of semiconductor devices.

In accordance with principles of inventive concepts, there is provided a method of fabricating a metal contact using double patterning technology (DPT). An exemplary method includes sequentially forming a first insulating layer and a first mask layer on a target layer in which a cell region and a peripheral region are defined, forming a first mask pattern by etching the first mask layer, the first mask pattern including a first opening formed in the cell region and a first hole formed in the peripheral region, the first opening having a rectangular shape (also referred to herein as a line shape), the major axis of which extends in a first direction and exposing the first insulating layer, the first hole exposing the first insulating layer, forming a first sacrificial pattern on the first mask pattern and the exposed first insulating layer of the cell region using a double patterning technology process, the first sacrificial pattern having a line, or rectangular, shape (the major axis of which) extending in a second direction perpendicular to the first direction, forming contact holes exposing the target layer by etching the first insulating layer using the first mask pattern and the first sacrificial pattern as an etch mask, and forming a metal contact by filling the contact holes with a metal material.

The formation of the first sacrificial pattern may include forming a first sacrificial layer to cover the first mask pattern and the exposed first insulating layer, sequentially forming a second sacrificial layer and an anti-reflection layer on the first sacrificial layer, forming a photoresist (PR) pattern on the anti-reflective layer of the cell region, the photoresist pattern having a line, or rectangular, shape extending in the second direction, forming a second opening exposing the first sacrificial layer by etching the anti-reflective layer and the second sacrificial layer using the photoresist pattern as an etch mask, forming spacers on sidewalls of the second opening, removing the sacrificial layer, and completing the first sacrificial pattern including a third opening exposing the first mask pattern by etching the first sacrificial layer using the spacers as an etch mask.

In accordance with principles of inventive concepts, the formation of the photoresist pattern may be performed without forming the photoresist pattern in the peripheral region, and the completion of the first sacrificial pattern may include exposing the first mask pattern of the peripheral region. The formation of the contact holes may include forming a contact hole defined by the first opening and corresponding to the first sacrificial pattern in the cell region and forming a contact hole corresponding to the first hole in the peripheral region.

The formation of the spacers may include forming a spacer layer to cover the anti-reflective layer, the second sacrificial layer, and the exposed first sacrificial layer and completing the spacers by etching back the spacer layer until the second sacrificial layer is exposed.

The formation of the first sacrificial pattern may include forming a first sacrificial layer to cover the first mask pattern and the exposed first insulating layer in the cell region, forming an anti-reflective layer on the first sacrificial layer, forming a photoresist pattern on the anti-reflective layer, the photoresist pattern having a line shape extending in the second direction, forming spacers on sidewalls of the photoresist pattern, removing the photoresist pattern, and completing the first sacrificial pattern including a second opening exposing the first mask pattern by etching the first sacrificial layer using the spacers as an etch mask.

In accordance with principles of inventive concepts, when a metal contact is formed in a flash memory device, the metal contact may be formed in a string overhead area corresponding to a region between two adjacent string selection lines of the flash memory device, and the second-directional width of the string overhead area may be determined by the second-directional width of the first opening. In another case, when the metal contact is formed in the DRAM memory device, an active region may be defined as a bar type by an isolation layer in the target layer along the first direction. Gate lines may be formed at a predetermined angle to the first direction, and the first opening may be formed in a portion of the target layer corresponding to the active region. Also, at least three contact holes may be formed in a portion of the target layer defined by the first opening.

According to another aspect of inventive concepts, there is provided a method of fabricating a metal contact using double patterning technology. The method includes forming a first insulating layer on a target layer in which a cell region and a peripheral region are defined, forming a mask pattern on the first insulating layer, the mask pattern including a first opening formed in a string overhead area between two adjacent string selection lines of the cell region and a first hole formed in the peripheral region, forming a first sacrificial pattern having a line-&-space shape on the mask pattern of the cell region using a double patterning technology process, forming a first contact hole in the string overhead area of the cell region and forming a second contact hole in the peripheral region by etching the first insulating layer using the mask pattern and the first sacrificial pattern as a mask, the first contact hole defined by the first opening and corresponding to the first sacrificial pattern, the second contact hole corresponding to the first hole, and forming a metal contact connected to the target layer of the cell region and the peripheral region by filling the first and second contact holes with a metal material.

According to another aspect of inventive concepts, there is provided a semiconductor device including a metal contact. The device includes a semiconductor substrate in which a cell region and a peripheral region are defined, a plurality of cell strings disposed on the semiconductor substrate of the cell region, each cell string including a plurality of cell transistors, a ground selection transistor, and a string selection transistor, a plurality of gate lines connected respectively to gate electrodes of the corresponding cell transistors of the plurality of cell strings, ground selection lines connected to gate electrodes of ground selection transistors of the plurality of cell strings, string selection lines connected to gate electrodes of string selection transistors of the plurality of cell strings, first metal contacts disposed on the semiconductor substrate in string overhead areas between two adjacent string selection lines, and second metal contacts disposed on the semiconductor substrate of the peripheral region. The first metal contacts are formed to a predetermined width at predetermined intervals and disposed in a row along a first direction in which the string selection lines extend. A width of the string overhead area measured in a second direction perpendicular to the first direction is determined by a second-directional width of the first metal contact.

In an exemplary embodiment in accordance with principles of inventive concepts an electronic device may include a cell region, a peripheral region, and a string overhead area that includes a double patterned metal contact. The metal contact may be a buried contact or a direct contact, for example. Additionally, the metal contact may be a self aligned reverse-patterned metal contact. In accordance with principles of inventive concepts, the electronic device may include a plurality of memory cells within the cell region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
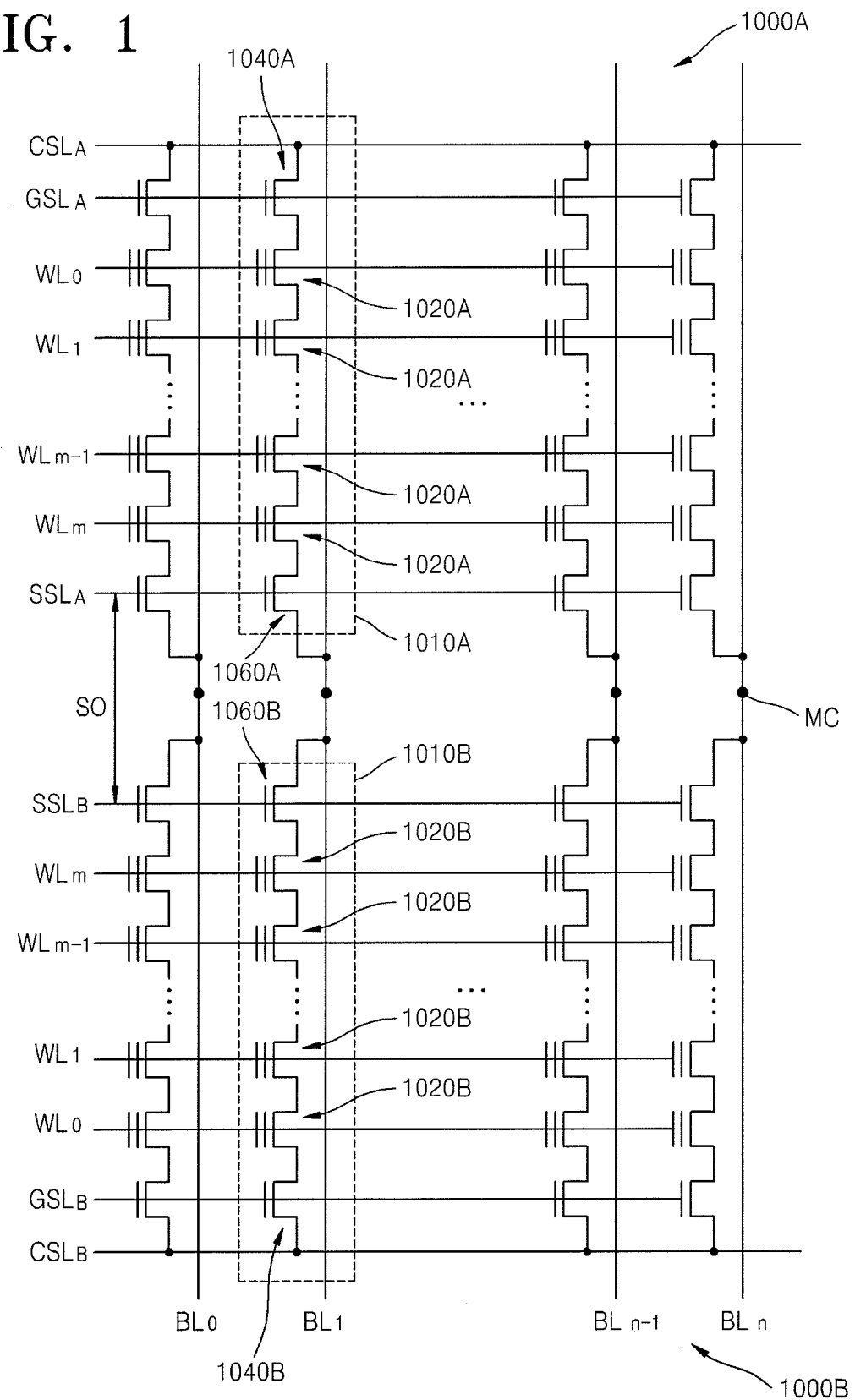
FIG. 1 is a circuit diagram of a memory cell array included in a memory device according to an exemplary embodiment in accordance with principles of inventive concepts.

Exemplary embodiments of the inventive concepts will now be described more fully with reference to the accompanying drawings, in which exemplary embodiments of the inventive concept are shown. Exemplary embodiments of the inventive concept may, however, be embodied in many different forms and should not be construed as limited to the embodiments set forth herein; rather, these exemplary embodiments of the inventive concept are provided so that this description will be thorough and complete, and will fully convey the concept of exemplary embodiments of the inventive concept to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of the inventive concept only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to cross-sectional illustrations that are schematic illustrations of idealized exemplary embodiments of the inventive concept (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a memory cell array such as may be included in a memory device according to an exemplary embodiment in accordance with principles of inventive concepts. A memory device, such as a flash memory, for example, may include a plurality of memory cell arrays 1000A, 1000B, etc. Any one of the memory cell arrays, for example, an upper memory cell array 1000A, may include a plurality of cell strings 1010A and each of the cell strings 1010A may include a plurality of memory cells 1020A connected in series. Gate electrodes of the memory cells 1020A included in each of the cell strings 1010A may be connected to respectively different word lines WL0, WL1, ..., WLm−1, and WLm.

A ground selection transistor 1040A connected to a ground selection line $GSL_A$ and a string selection transistor 1060A connected to a string selection line $SSL_A$ may be respectively disposed at either end of cell string 1010A. Ground selection transistor 1040A and string selection transistor 1060A may control electrical connection of memory cells 1020A with bit lines BL0, BL0, BL1, ..., BLn−1, and BLn and a common source line $CSL_A$. Memory cells connected to one word line through cell strings 1010A may be formed in page units or byte units, for example.

In the above-described flash memory device, to select a predetermined memory cell and perform a read or write operation, an X-decoder block (not shown) and a Y-decoder block (not shown) may select the word lines WL0, WL1, ..., WLm−1, and WLm and the bit lines BL0, BL1, ..., BLn−1, and BLn of the memory cell array 1000a, respectively, to select the corresponding memory cell, for example.

A lower memory cell array 1000B may have a similar structure to that of upper memory cell array 1000A. However, a selection transistor 1040B, a ground selection line $GSL_B$, a string selection transistor 1060B, a string selection line $SSL_B$, and a common source line $CSL_B$ may be disposed in opposite positions to the corresponding elements of upper memory cell array 1000A. That is, string selection lines $SSL_A$ and $SSL_B$ of each of the two adjacent memory cell arrays 1000A and 1000B may be disposed adjacent to each other, and a region between the two adjacent string selection lines $SSL_A$ and $SSL_B$ may be referred to as a string overhead (SO), or string overhead area (SO). A metal contact MC configured to connect active regions (e.g., drain regions) of respective strings to the bit lines BL0, BL1, ..., BLn−1, and BLn may be formed in the string overhead area SO.

Along with reductions in scale associated with an increase in the density of memory devices, the area available for formation of metal contacts MC within a string overhead area (SO) has been reduced. In a memory device in accordance with principles of inventive concepts, a metal contact MC formed in string overhead area SO may be formed using a double patterning technology (DPT) process. Accordingly, metal contacts MC may be disposed in a row along a first direction in which string selection lines run, and the size of the string overhead area SO may be reduced according to the width of the metal contacts MC measured in a second direction perpendicular to the first direction.

Figure 2:
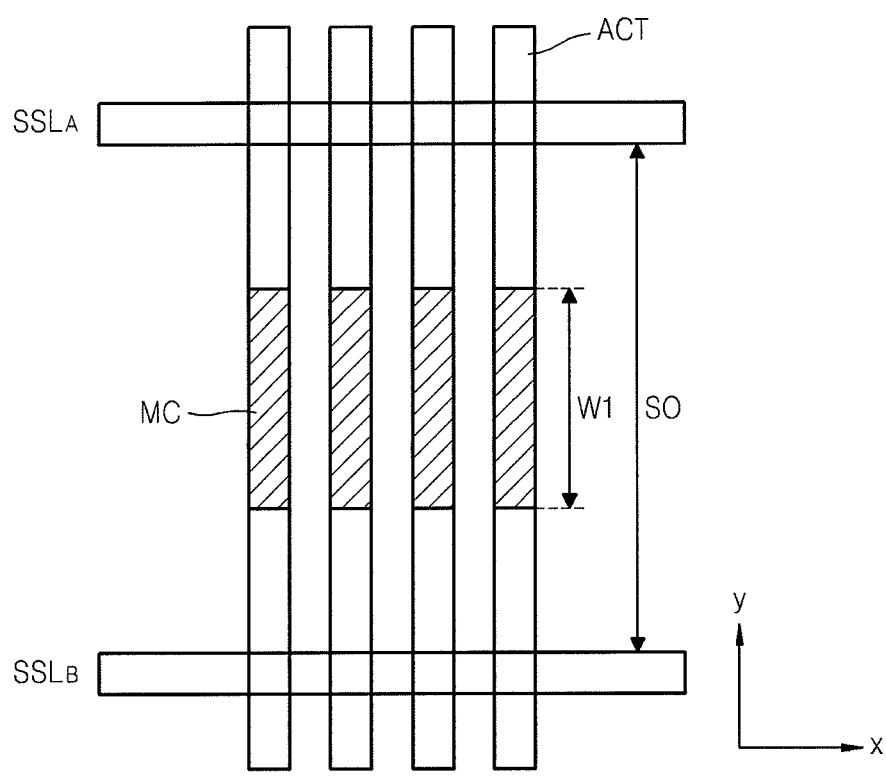
FIG. 2 is an enlarged plan view of a string overhead area of the memory cell array of FIG. 1.

The plan view of FIG. 2 depicts an enlarged view of an exemplary embodiment in accordance with principles of inventive concepts of a string overhead area such as that described in the discussion related to the memory cell array of FIG. 1. As previously described, metal contacts MC may be disposed in a row along a first direction (x direction in this exemplary embodiment) in a string overhead area SO between two adjacent string selection lines $SSL_A$ and $SSL_B$. A second-directional (y-directional in this exemplary embodiment) width of string overhead area SO may be determined by a second-directional width W1 of metal contacts MC. That is, the second-directional width of the string overhead area SO may be defined by, or reduced to, a value equal to the second-directional width W1 of the metal contact MC.

In accordance with principles of inventive concepts, metal contact MC may be formed using a double patterning technology (DPT) process, an exemplary embodiment of which will be described in detail in the discussion related to FIGS. 3A through 18B. In exemplary embodiments in accordance with principles of inventive concepts, each of the metal contacts MC may be formed in the corresponding one of active regions ACT where drain regions are formed.

FIGS. 3A through 12C are plan views and cross-sectional views illustrating a method of forming a metal contact using a double patterning technology process according to an exemplary embodiment in accordance with principles of inventive concepts. FIGS. 3A, 4A, 5A, 6A, 7A, 8A, 9A, 10A, 11A, and 12A are plan views showing respective operations of a process of forming a metal contact MC according to an exemplary embodiment in accordance with principles and concepts, and FIGS. 3B, 4B, 5B, 6B, 7B, 8B, 9B, 10B, 11B, and 12B are cross-sectional views taken along line I-I' of FIGS. 3A, 4A, 5A, 6A, 7A, 8A, 9A, 10A, 11A, and 12A, respectively. FIGS. 3C, 4C, 5C, 6C, 7C, 8C, 9C, 10C, 11C, and 12C are cross-sectional views taken along line of FIGS. 3A, 4A, 5A, 6A, 7A, 8A, 9A, 10A, 11A, and 12A, respectively.

Figure 3A:
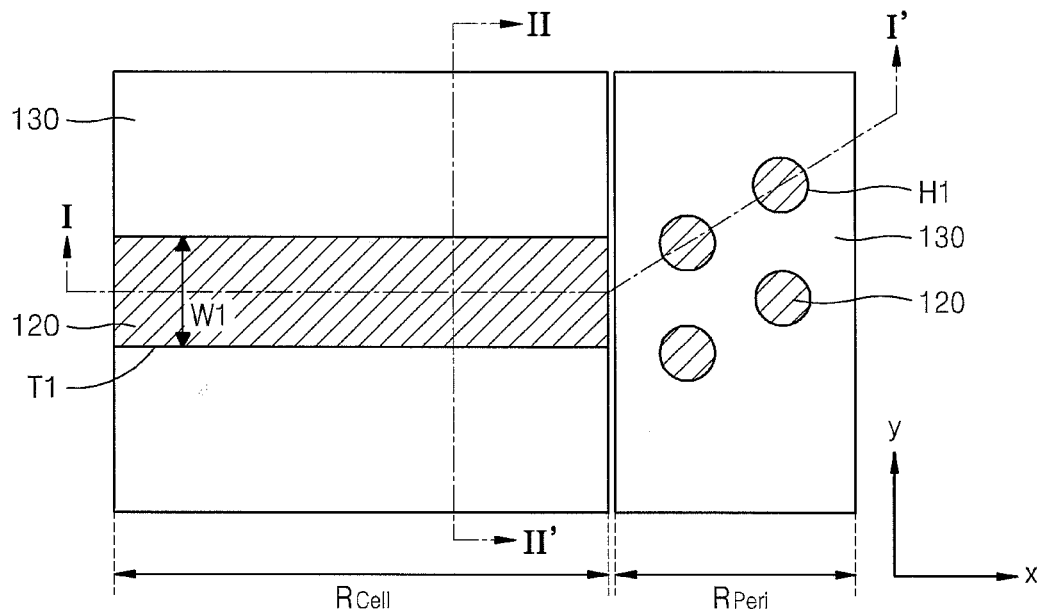
FIGS. 3A through 12C are plan views and cross-sectional views illustrating a method of forming a metal contact using a double patterning technology (DPT) process according to an exemplary embodiment in accordance with principles of inventive concepts.
Figure 3B:
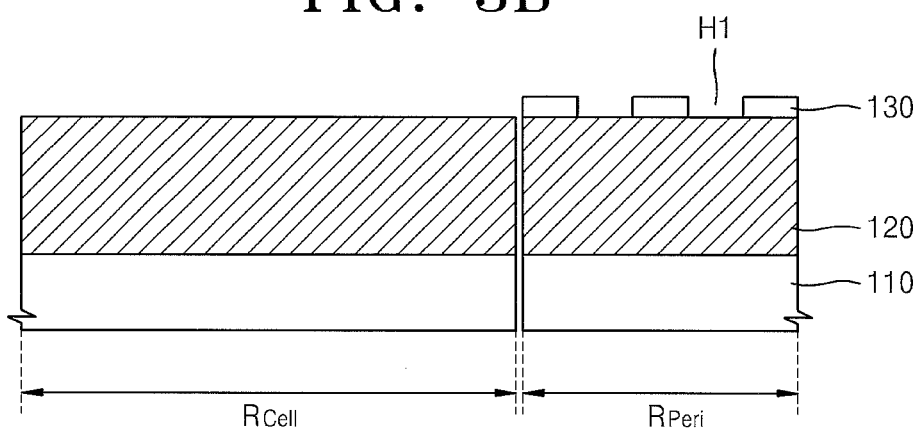
Figure 3C:
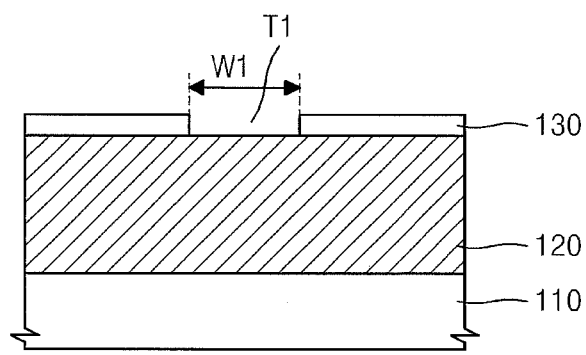

Referring to FIGS. 3A through 3C, initially, a first insulating layer 120 and a first mask layer (not shown) may be sequentially formed on a target layer 110. Target layer 110 may be a semiconductor substrate on which an active region is formed. Target layer 110 may be divided into a cell region $R_{Cell}$ in which memory cell are formed and a peripheral region $R_{Peri}$ disposed in the vicinity of the cell region $R_{Cell}$.

First insulating layer 120 may be formed using an oxide layer, a nitride layer, or a combination thereof, for example. The first mask layer may be formed of a material having an etch selectivity with respect to the first insulating layer 120. For example, the first insulating layer 120 may be formed using an oxide layer, a thermal oxide layer, a chemical vapor deposition (CVD) oxide layer, a undoped silicate glass (USG) layer, or a high-density-plasma (HDP) oxide layer and the first mask layer may be formed using a nitride layer, a silicon oxynitride (SiON) layer, a silicon nitride (SiN) layer, or a silicon boron nitride (SiBN) layer. In the present embodiment, the first mask layer may be formed using a SiN layer. The first mask layer may be formed to a much smaller thickness than the first insulating layer 100, for example, about 300 Å.

After forming first insulating layer 120 and first mask layer, a photoresist (PR) layer (not shown) may be formed on first mask layer, and a predetermined photoresist pattern (not shown) may be formed using a photolithography process. The photoresist pattern may include a line-type, or rectangular, open region extending in a first direction (or an x direction) in cell region $R_{Cell}$ and an open region having the same shape as a desired metal contact (e.g., a circular open region) disposed in peripheral region $R_{Peri}$.

Subsequently, the first mask layer may be etched using the photoresist pattern as an etch mask, thereby forming a first mask pattern 130. First mask pattern 130 may have the same shape as the photoresist pattern. That is, first mask pattern 130 may include a first opening T1 having a line, or rectangular, shape extending in the first direction (x direction in an exemplary embodiment) in cell region $R_{Cell}$ and a first hole(s) H1 having a circular shape and disposed in peripheral region $R_{Peri}$. A portion of a top surface of first insulating layer 120 may be exposed by first opening T1 and first hole H1. FIGS. 3A through 3C illustrate the resultant structure from which the photoresist pattern is removed after the first mask pattern 130 is formed.

A second-directional (y-directional) width W1 of first opening T1 (that is, the width W1 of first opening T1) may be determined by a second-directional width of a metal contact MC formed during a subsequent process, for example. Also, second-directional width W1 of the first opening T1 may be determined by a second-directional width of the string overhead area SO. That is, the second-directional width W1 of the first opening T1 may be limited by the second-directional width of the string overhead area SO. Thus, a reduction in the second-directional width of the string overhead area SO may depend on the second-directional width W1 of the first opening T1.

Figure 4A:
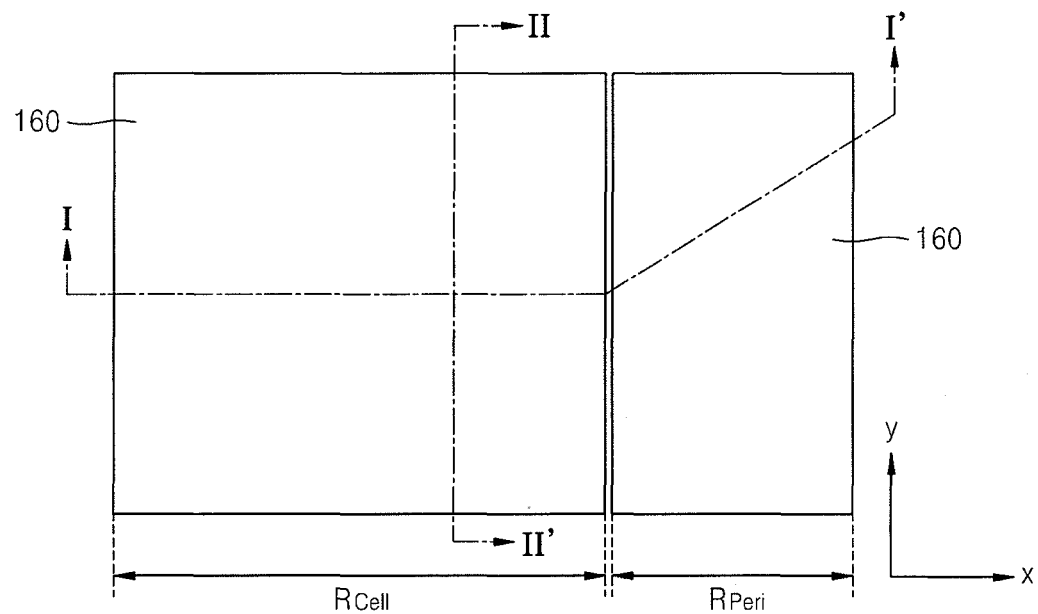
Figure 4B:
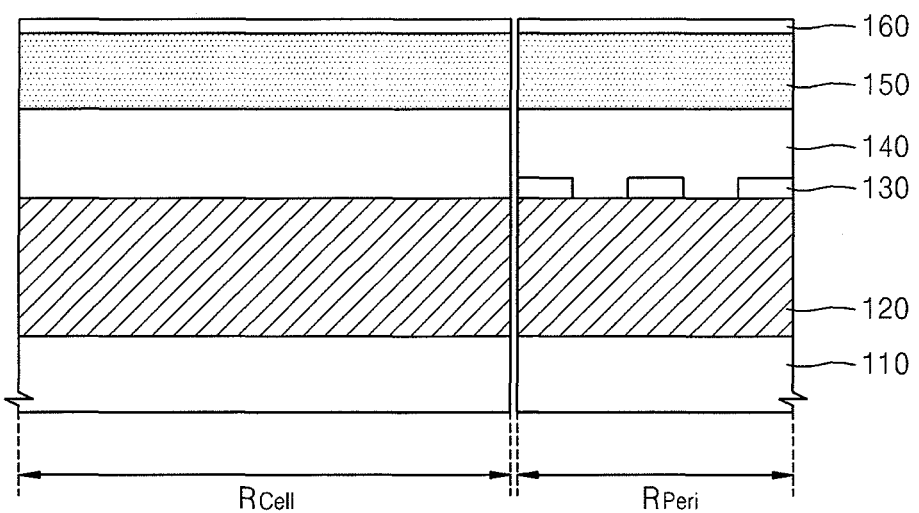
Figure 4C:
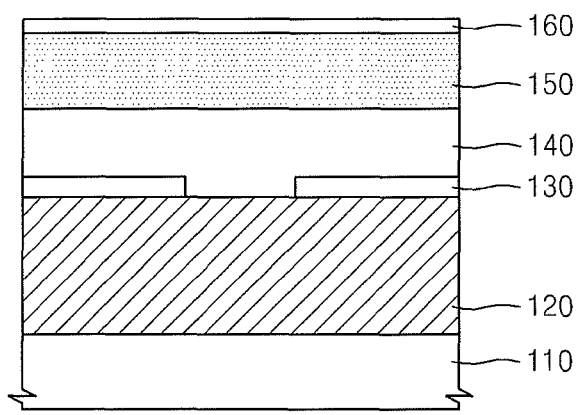

Referring to FIGS. 4A through 4C, after forming first mask pattern 130, first sacrificial layer 140, second sacrificial layer 150, and anti-reflection layer 160 may be sequentially formed on first mask pattern 130, in accordance with principles of inventive concepts. First sacrificial layer 140 may be formed of a material having an etch selectivity with respect to first insulating layer 120 and first mask pattern 130. For example, when first insulating layer 120 may be formed of an oxide layer and first mask pattern 130 of a nitride layer, first sacrificial layer 140 may be formed of polysilicon (poly-Si).

Second sacrificial layer 150 may be formed of a material having an etch selectivity with respect to first sacrificial layer 140. For example, when first sacrificial layer 140 is formed of poly-Si, second sacrificial layer 150 may be an amorphous carbon layer (ACL) or a spin-on hard mask (SOH) layer. In an exemplary embodiment SOH refers to a hard mask layer having a high-carbon (C) content, which is formed of hydrocarbon (HC) or a derivative thereof containing C at a content of approximately 85 to 99% by weight, based on the total weight thereof. Antireflective layer 160 may prevent reflection of light during a photolithography process and may be formed of a SiON layer, for example.

Figure 5A:
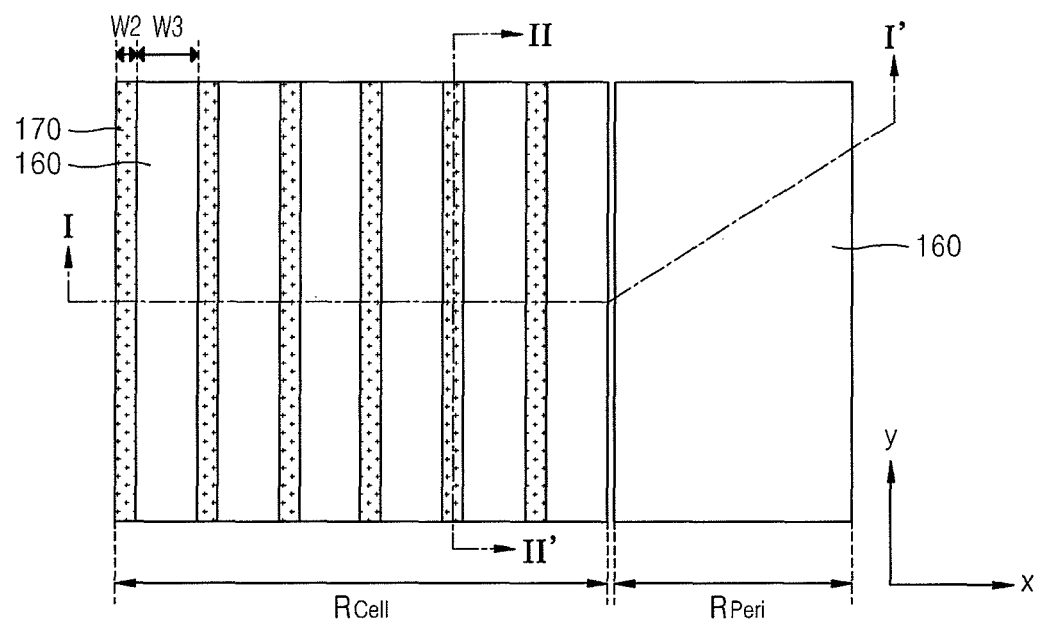
Figure 5B:
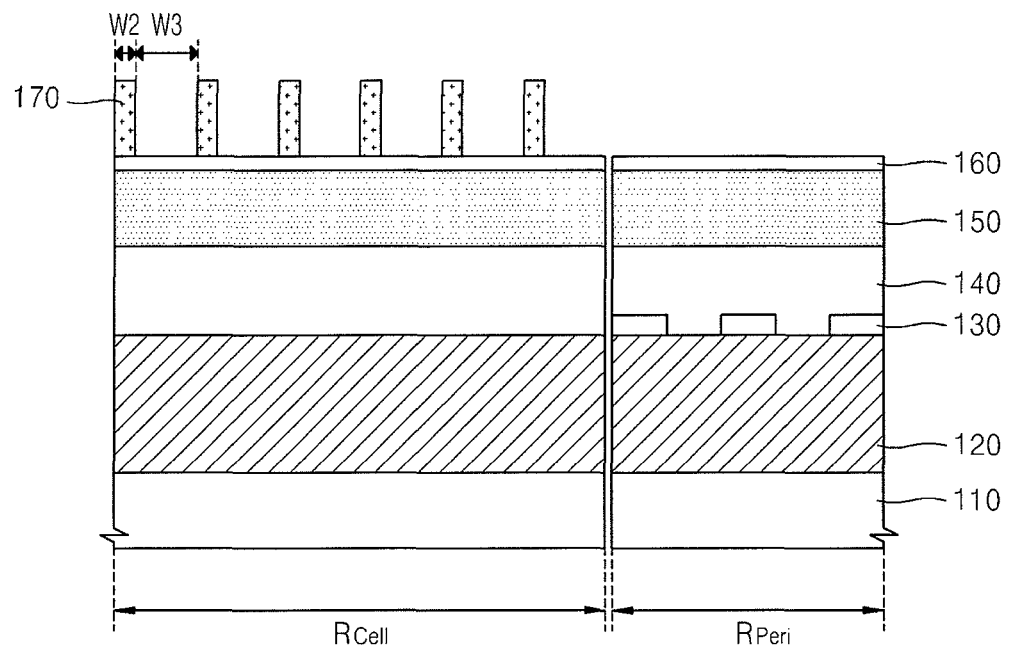
Figure 5C:
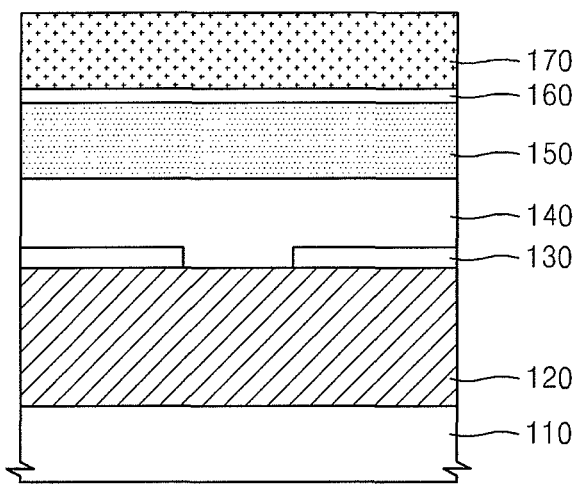

Referring to FIGS. 5A through 5C, a line-and-space photoresist pattern 170 may be formed on anti-reflective layer 160 formed in the cell region $R_{Cell}$. A first-directional width of a line-type pattern extending in the second direction may have a second width W2, and an interval between patterns may have a third width W3. Third width W3 may be three times as great as second width W2, for example. In an exemplary embodiment in accordance with principles of inventive concepts, no photoresist pattern may be formed on anti-reflective layer 160 disposed in peripheral region $R_{Peri}$.

Figure 6A:
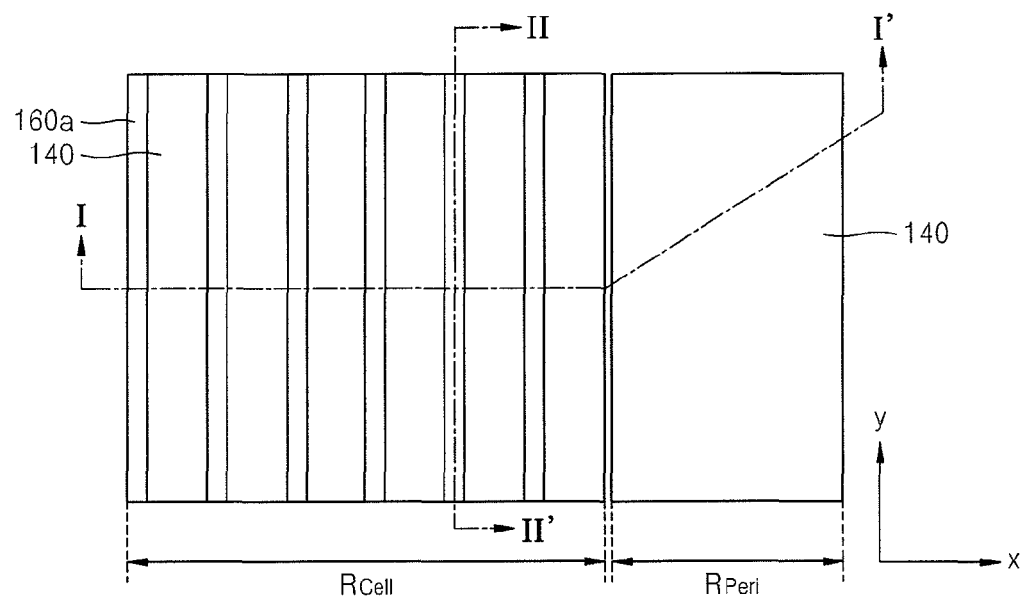
Figure 6B:
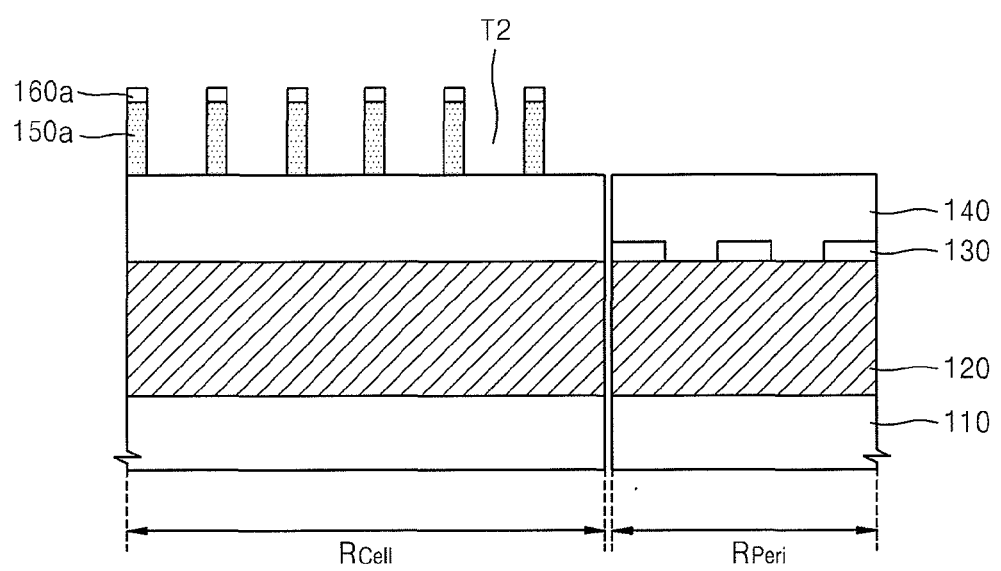
Figure 6C:
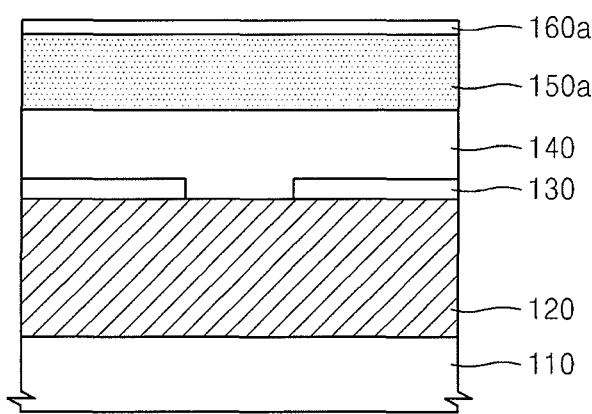

Referring to FIGS. 6A through 6C, anti-reflective layer 160 and second sacrificial layer 150 may be etched using photoresist pattern 170 formed in the cell region $R_{Cell}$ as an etch mask, thereby forming an anti-reflective layer pattern 160a and a second sacrificial pattern 150a. photoresist pattern 170 may be removed. A second opening T2 may be formed in anti-reflective layer pattern 160a and second sacrificial pattern 150a to partially expose a top surface of first sacrificial layer 140.

Because, in this exemplary embodiment, no photoresist pattern is formed in peripheral region $R_{Peri}$, both anti-reflective layer 160 and second sacrificial layer 150 may be etched to expose the entire top surface of the first sacrificial layer 140.

Figure 7A:
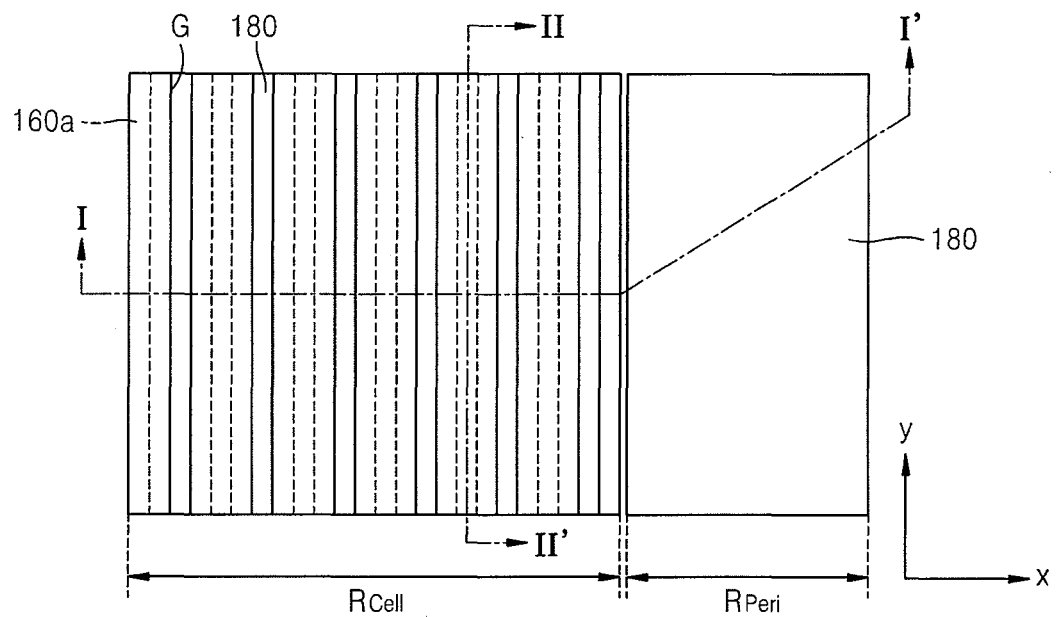
Figure 7B:
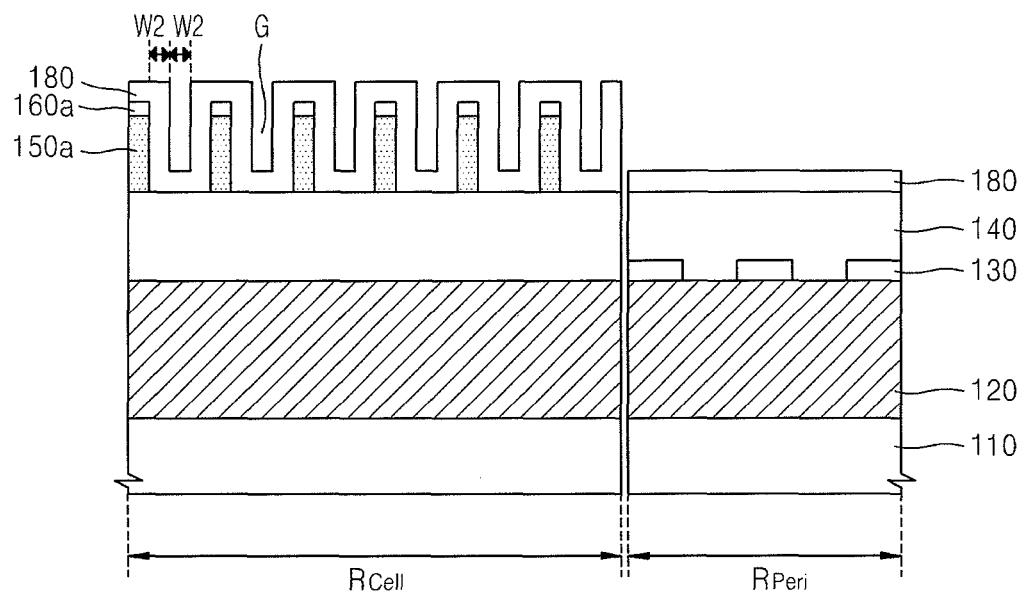
Figure 7C:
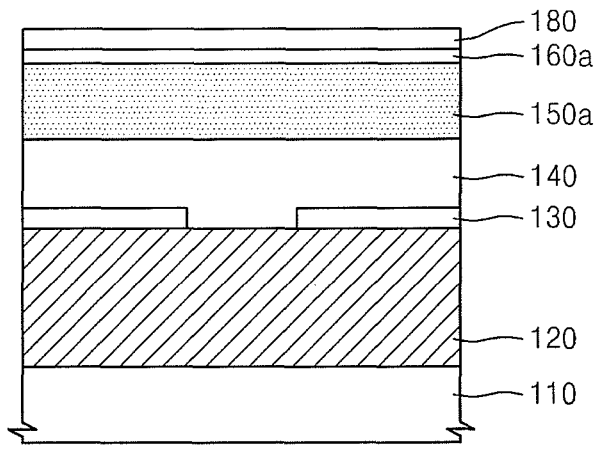

Referring to FIGS. 7A through 7C, a spacer layer 180 may be formed to cover anti-reflective layer pattern 160a, second sacrificial pattern 150a, and exposed first sacrificial layer 140. Spacer layer 180 may be formed to a uniform thickness, for example, to a thickness equal to first width W2 of second sacrificial pattern 150a. In this manner, a groove G having the second width W2 may be formed in the second opening T2 in accordance with principles of inventive concepts.

Spacer layer 180 may be formed of an oxide layer, such as a medium temperature oxide (MTO) layer, for example. Spacer layer 180 may be formed using an atomic layer deposition (ALD) process to obtain a uniform thickness, and, as a result, spacer layer 180 may be referred to as an ALD layer.

Because anti-reflective layer pattern 160a and second sacrificial pattern 150a are not formed in peripheral region $R_{Peri}$, spacer layer 180 may cover the entire top surface of first sacrificial layer 140.

Figure 8A:
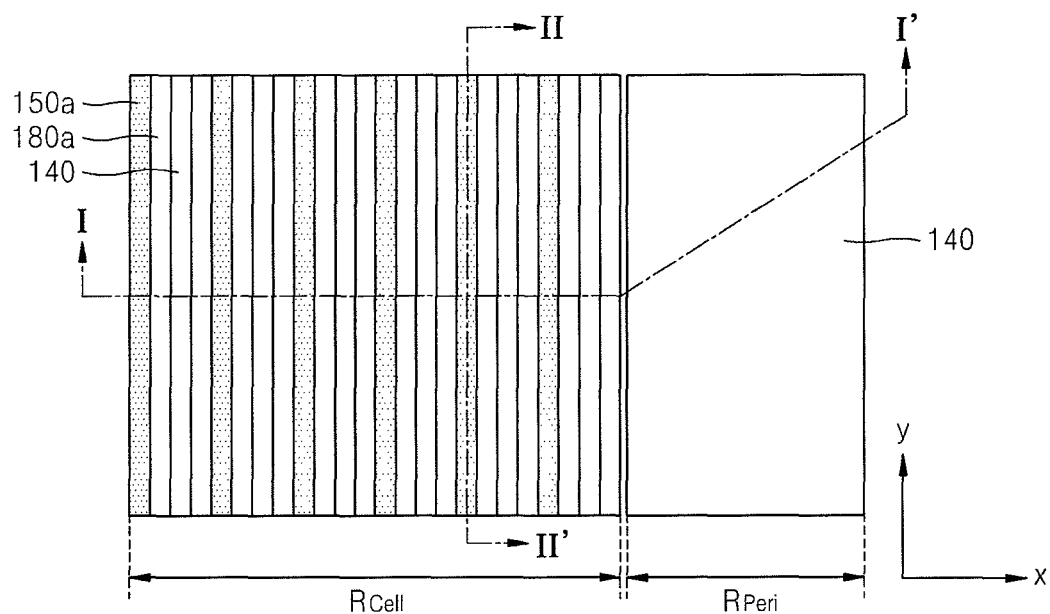
Figure 8B:
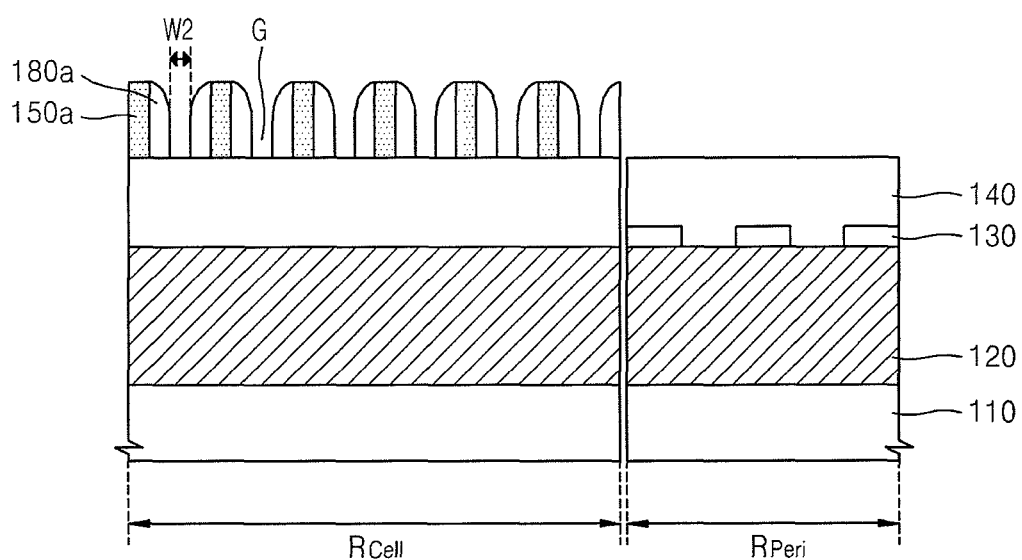
Figure 8C:
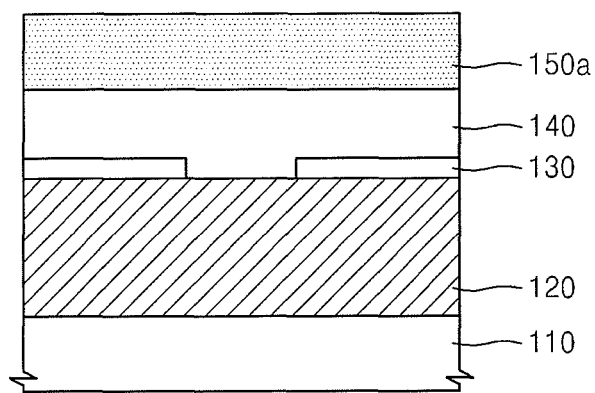

Referring to FIGS. 8A through 8C, spacer layer 180 may be etched back until second sacrificial pattern 150a is exposed, thereby forming spacers 180a on sidewalls of second sacrificial pattern 150a or sidewalls of second opening T2. A bottom surface of groove G may also be etched during formation of spacers 180a so that first sacrificial layer 140 can be exposed through groove G. An interval between spacers 180a may be of second width W2, corresponding to the width of groove G. The entire spacer layer 180 may be removed using an etch-back process from peripheral region $R_{Peri}$ to expose the entire top surface of first sacrificial layer 140.

Figure 9A:
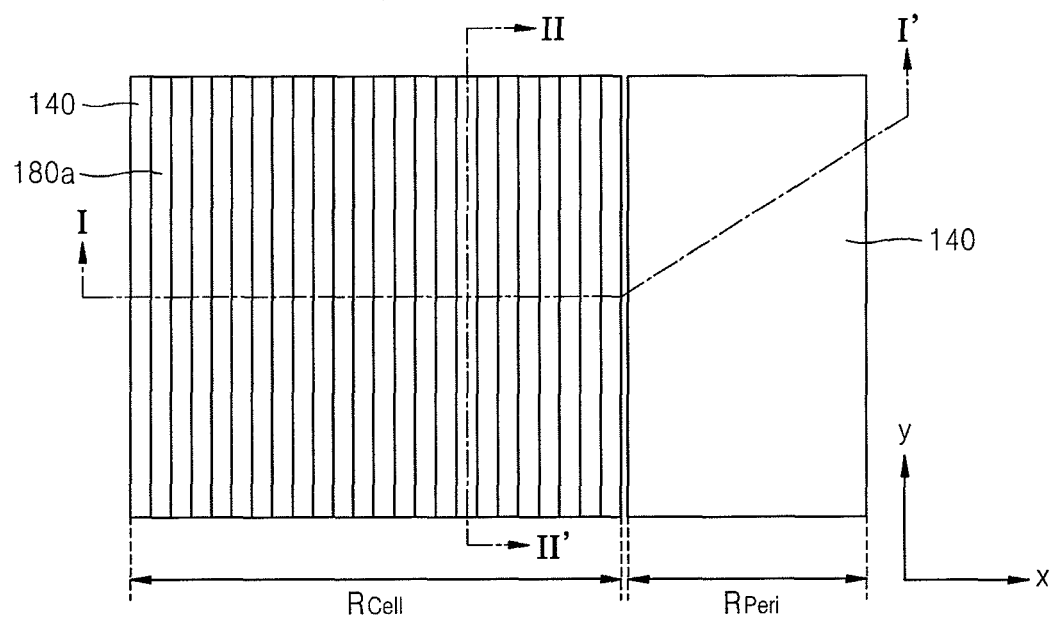
Figure 9B:
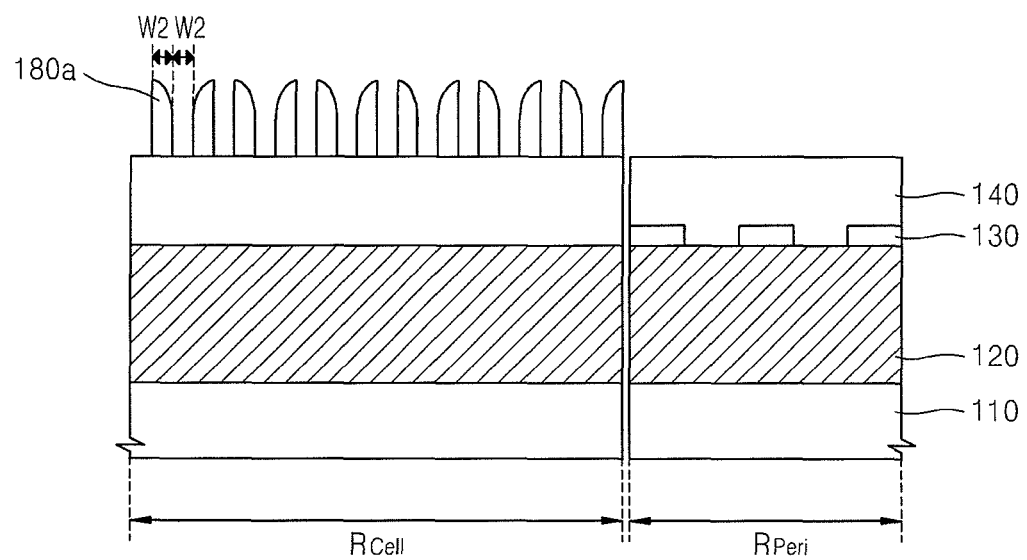
Figure 9C:
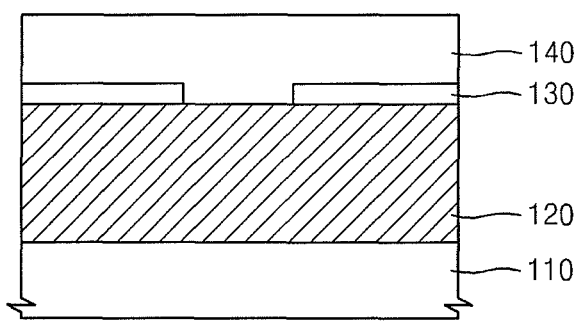

Referring to FIGS. 9A through 9C, second sacrificial pattern 150a may be removed to leave only spacers 180a on first sacrificial layer 140. The removal of second sacrificial pattern 150a may be performed under conditions where the etching of spacers 180a is suppressed. For example, second sacrificial pattern 150a may be removed using a strip process or a dry or wet etching process. After removing second sacrificial pattern 150a, only spacers 180a having a width equal to second width W2 at intervals of second width W2 may be left on first sacrificial layer 140 formed in the cell region $R_{Cell}$.

Figure 10A:
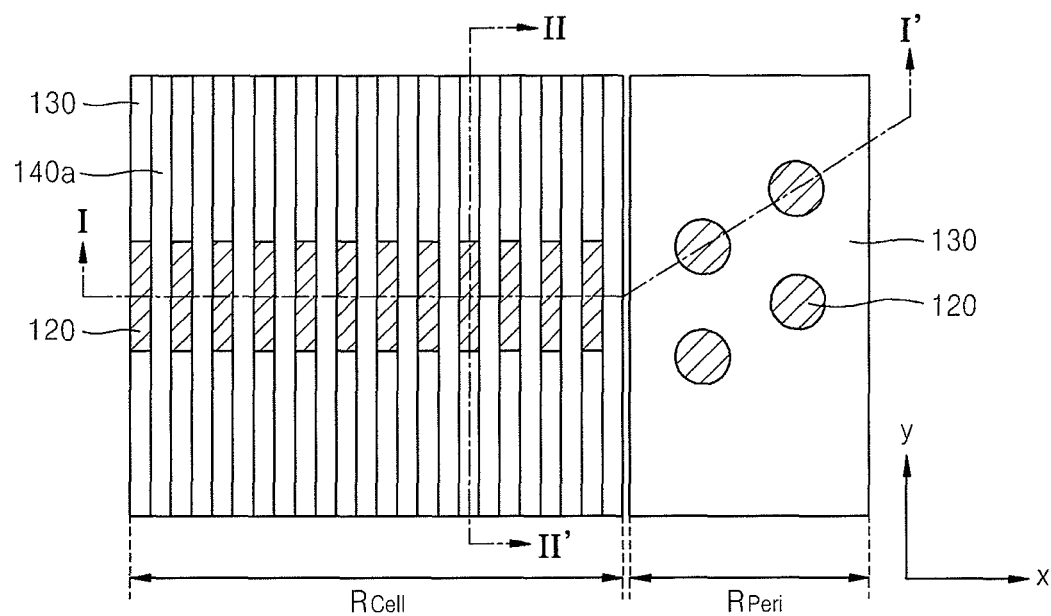
Figure 10B:
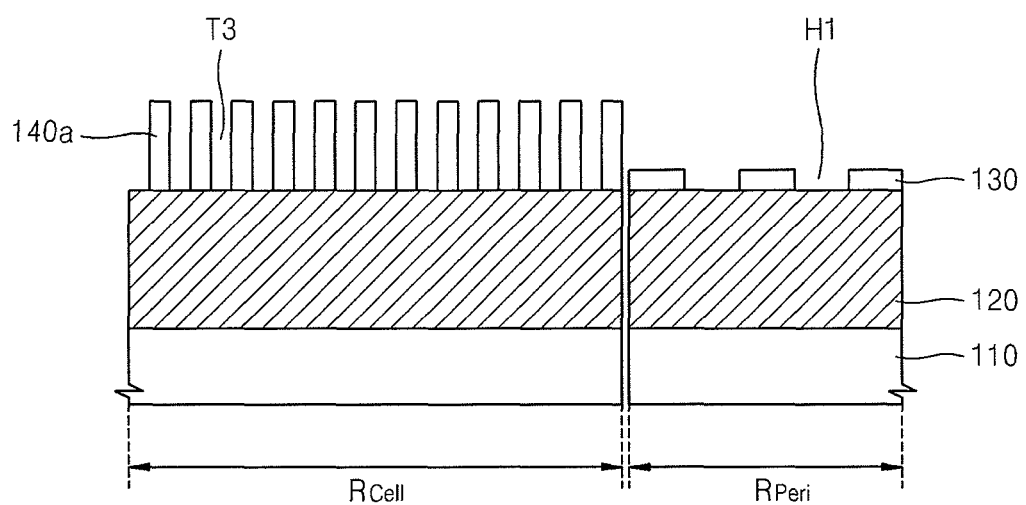
Figure 10C:
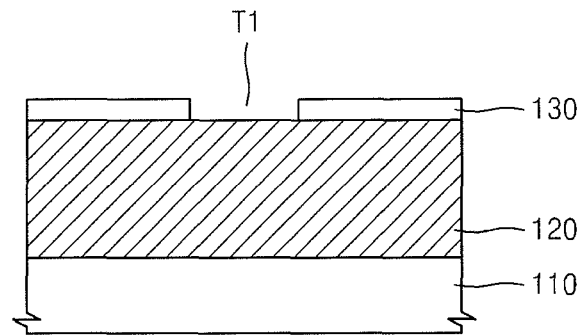

Referring to FIGS. 10A through 10C, first sacrificial layer 140 may be etched using spacers 180a as an etch mask, thereby forming a first sacrificial pattern 140a including third opening(s) T3. First mask pattern 130 and first insulating layer 120 may be exposed through third opening T3. First insulating layer 120 may be alternately exposed along the first direction in a pattern of alternating strips defined by the overlap between first and third openings, T1 and T3. That has, as can be seen from exemplary embodiments in accordance with principles of inventive concepts as illustrated in FIGS. 3A and 3B only a portion of the first insulating layer 120 exposed by first opening T1 is exposed by third opening T3, and, as a result, first insulating layer 120 may be exposed in a portion where first and third openings T1 and T3 overlap each other.

Because no spacers are formed in peripheral region $R_{Peri}$, the entire first sacrificial layer 140 may be removed to expose first insulating layer 120 through first mask pattern 130 and first hole H1.

In general, the processes described with reference to FIGS. 4A through 10C may be referred to as a double patterning technology (DPT) process. In particular, a double patterning technology process performed using spacers as a mask as in this exemplary embodiment may be referred to as a self-aligned reverse patterning (SARP) process.

Figure 11A:
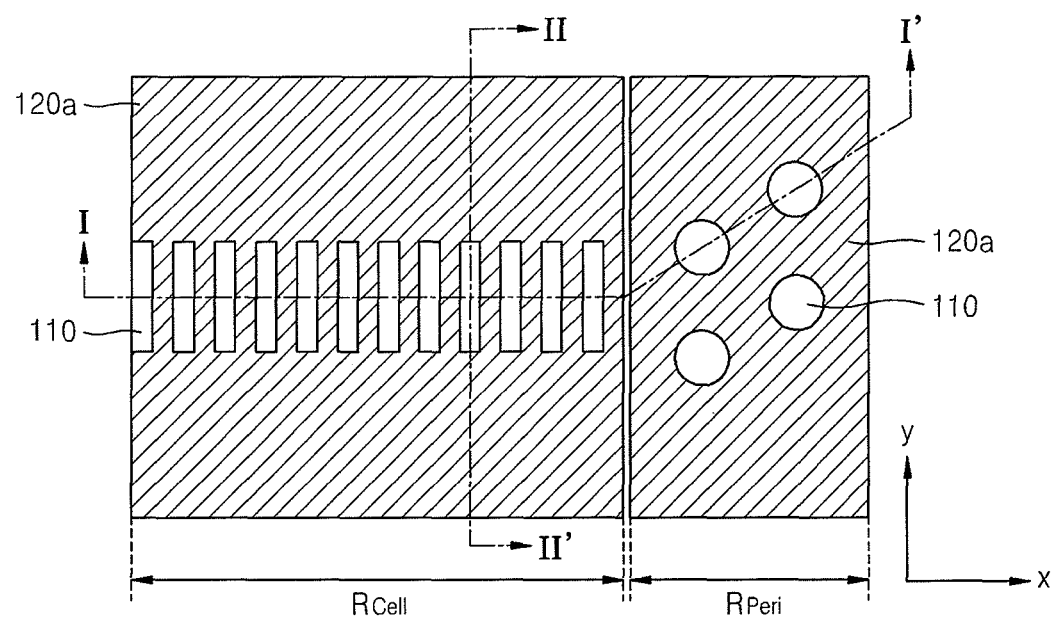
Figure 11B:
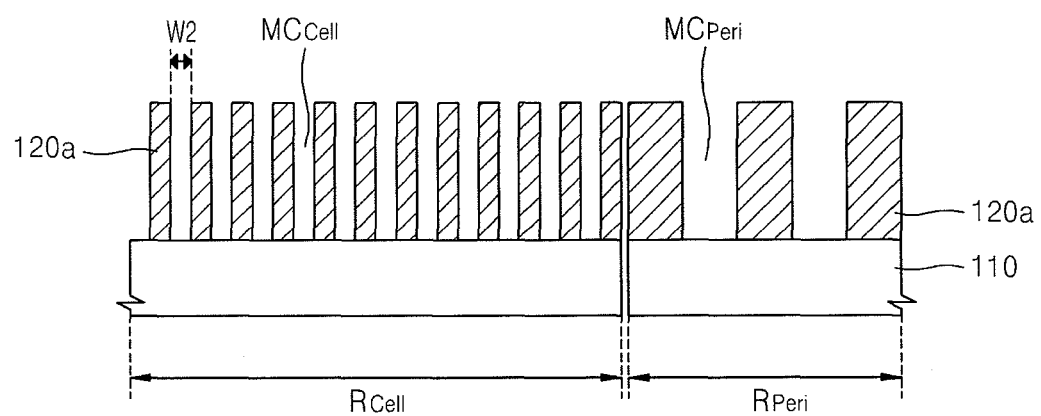
Figure 11C:
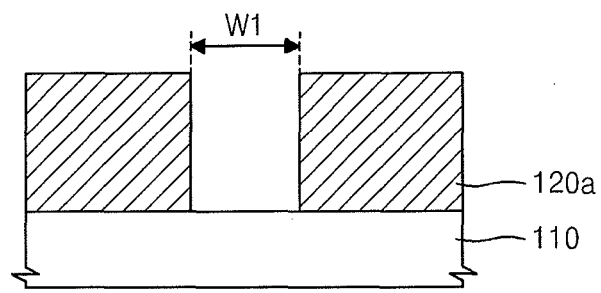

In an exemplary embodiment in accordance with principles of inventive concepts, as illustrated in FIGS. 11A through 11C, in cell region $R_{Cell}$, first insulating layer 120 may be etched using first sacrificial pattern 140a and first mask pattern 130 as a mask. In peripheral region $R_{Peri}$, first insulating layer 120 may be etched using only first mask pattern 130 as a mask. As a result, first insulating pattern 120a may be formed to expose a top surface of target layer 110, which may be, for example, a top surface of a semiconductor substrate.

In cell region $R_{Cell}$, because first sacrificial pattern 140a and first mask pattern 130 are used as a mask, first contact holes MCcell may be alternately formed in first insulating pattern 120a along a first direction. A first directional width of each of first contact hole MCCell may be a second width W2, and a second directional width thereof may be a first width W1.

In peripheral region $R_{Peri}$, because only first sacrificial pattern 140a including first hole H1 is used as a mask, second contact holes MCPeri corresponding to first holes H1 may be formed in first insulating pattern 120a. FIGS. 11A through 11C illustrate resultant structures from which first sacrificial pattern 140a and first mask pattern 130 are removed after first insulating pattern 120a is formed.

Figure 12A:
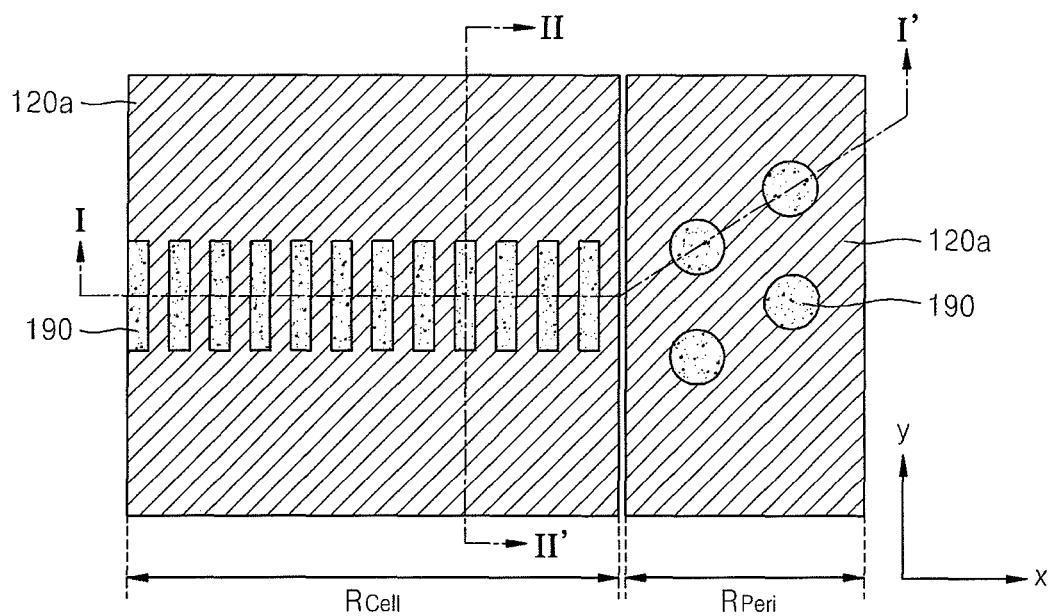
Figure 12B:
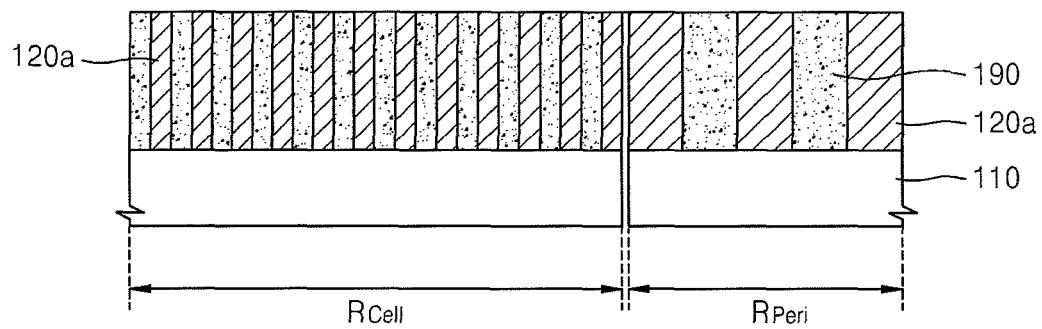
Figure 12C:
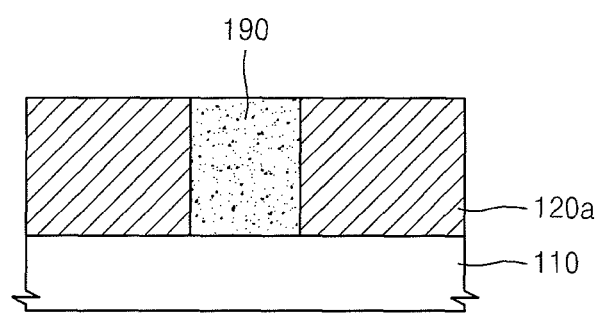

In an exemplary embodiment in accordance with principles of inventive concepts illustrated in FIGS. 12A through 12C, first contact holes MCCell of cell region $R_{Cell}$ and second contact holes MCPeri of peripheral region $R_{Peri}$ may be filled with a metal material using, for example, a deposition process, and the remaining metal material may be removed from a top surface of first insulating pattern 120a through planarization process, for example, thereby simultaneously forming metal contacts 190 in both the cell region $R_{Cell}$ and the peripheral region $R_{Peri}$.

In a method of fabricating a metal contact using a double patterning technology process according to an exemplary embodiment in accordance with principles of inventive concepts, the second-directional width of the string overhead area SO may be greatly reduced in a semiconductor device such as a flash memory device, for example. That is, the second-directional width of first opening T1 of first mask pattern 130 of cell region $R_{Cell}$ may be controlled to satisfy a specified second-directional width requirement of the string overhead area SO. Thereafter, metal contact 190 appropriate for string overhead area SO may be formed using a double patterning technology process. Along with a reduction in the 2-directional width of string overhead area SO, the size of a flash memory device also may also be sharply reduced.

Although the exemplary embodiment in accordance with principles of inventive concepts described includes metal contacts formed to a width equal to the second width W2 at intervals of the second width W2, inventive concepts are not limited thereto, and metal contacts may be formed to various widths at various intervals. The width and interval of metal contacts 190 may be controlled by adjusting the width and interval of the photoresist pattern of FIG. 5A or 5B. If the photoresist patterns were to have a width equal to the second width W2 and are arranged at intervals of five times the second width W2, resultant metal contacts may have a width equal to the second width W2 and be arranged at intervals of three times the second width W2, for example.

Although it is assumed in the exemplary embodiment in accordance with principles of inventive concepts just described that target layer 110 is a single layer formed of the same material, if the target layer 110 is, for example, a semiconductor substrate where active regions are formed, isolation layers may be formed along the first direction to define active regions. In such exemplary embodiments, the width(s) of metal contacts connected to the active regions and an interval between the metal contacts may be determined by the width of the active regions and an interval between the active regions.

FIGS. 13A through 18B are plan views and cross-sectional views, respectively, illustrating a method of forming a metal contact using a double patterning technology process according to another exemplary embodiment in accordance with principles of inventive concepts, which illustrate a different double patterning technology process from the double patterning technology process described in the discussion related to FIGS. 4A through 10C of the method of forming the metal contact shown in FIGS. 3A through 12C. Because processes described in the discussion related to FIGS. 3A through 3C and 11A through 12C may be applied in the same manner to the method of forming the metal contact according to the present exemplary embodiment, a description thereof will be omitted for brevity. FIGS. 13A through 18A are plan views showing respective operations of a double patterning technology process in accordance with principles of inventive concepts, and FIGS. 13B through 18B are cross-sectional views taken along lines I-I' of FIGS. 13A through 18A, respectively.

Figure 13A:
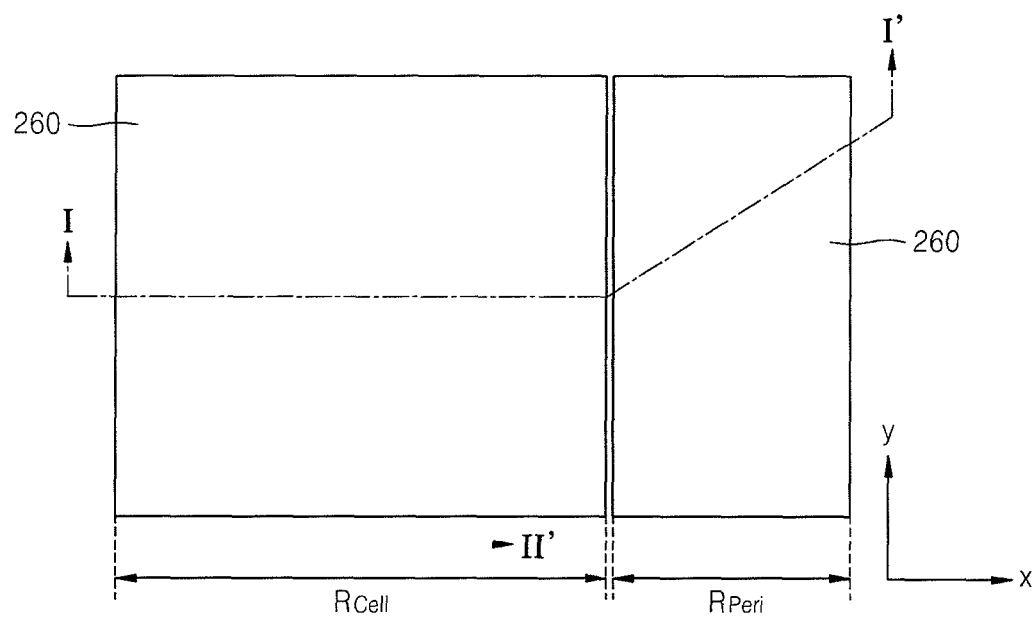
FIGS. 13A through 18B are plan views and cross-sectional views illustrating a method of forming a metal contact using a double patterning technology process according to another exemplary embodiment in accordance with principles of inventive concepts.
Figure 13B:
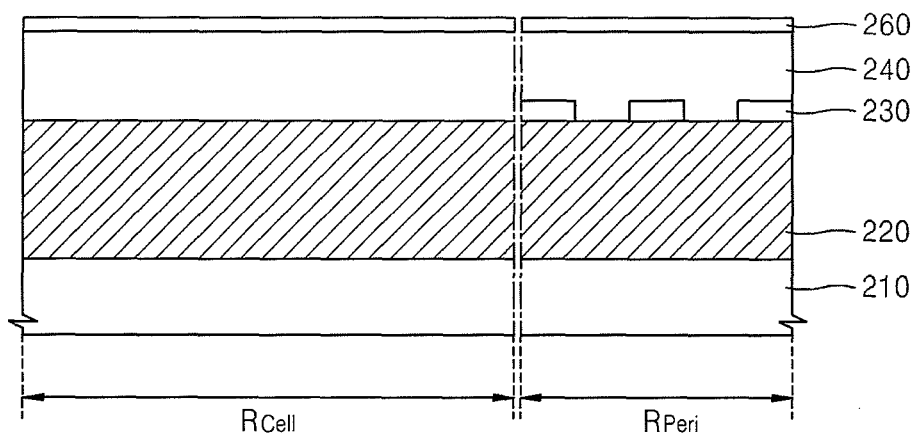

In exemplary embodiments in accordance with principles of inventive concepts depicted in FIGS. 13A and 13B, initially, a first insulating layer 220 and a first mask pattern 230 may be formed on target layer 210 in, for example, the same manner as described in the discussion related to FIGS. 3A through 3C. First sacrificial layer 240 and anti-reflective layer 260 may be sequentially formed on mask pattern 230. First sacrificial layer 240 may be formed of, for example, poly-Si. Anti-reflective layer 160 may be formed of, for example, silicon oxynitride (SiON). In an exemplary embodiment, a second sacrificial layer may be omitted (unlike the exemplary embodiment depicted in FIGS. 4A through 4C).

Figure 14A:
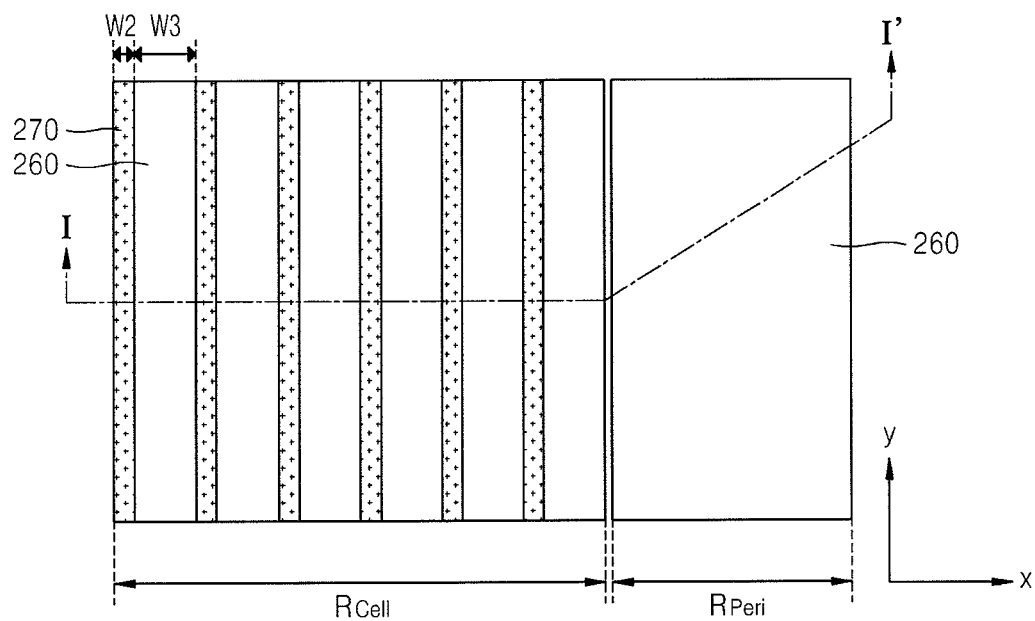
Figure 14B:
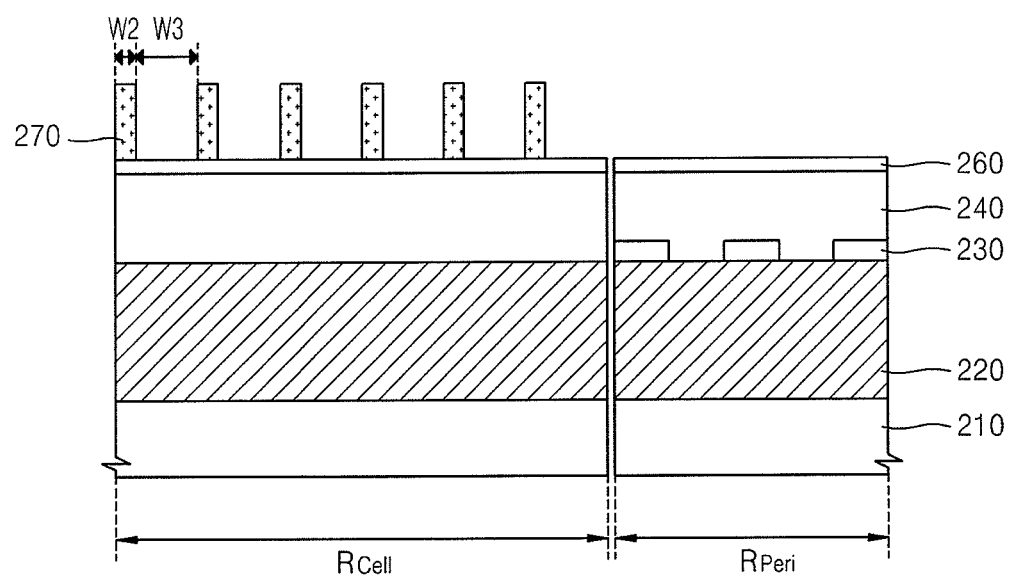

Referring to FIGS. 14A and 14B, line-and-space photoresist patterns 270 may be formed on anti-reflective layer 260 of cell region $R_{Cell}$. A first directional width of line-type (also referred to as rectangular-type) patterns extending in a second direction (that is, in a direction perpendicular to the first direction) may be a second width W2, and an interval between line-type patterns may correspond to a third width W3. In an exemplary embodiment in accordance with principles of inventive concepts width W3 may be three times second width W2, for example, and a photoresist pattern may not be formed on anti-reflective layer 260 of peripheral region $R_{Peri}$.

Figure 15A:
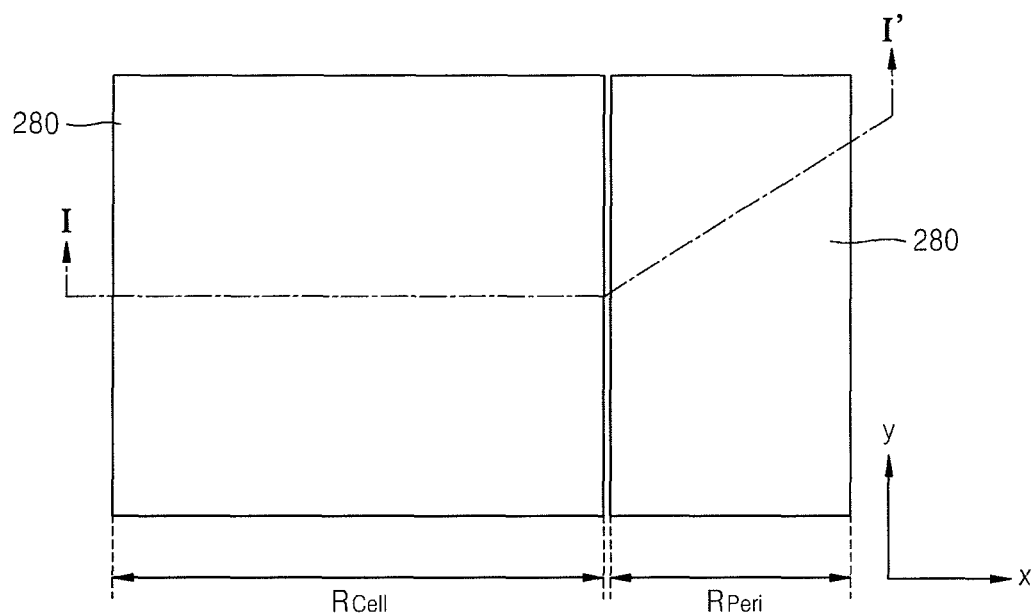
Figure 15B:
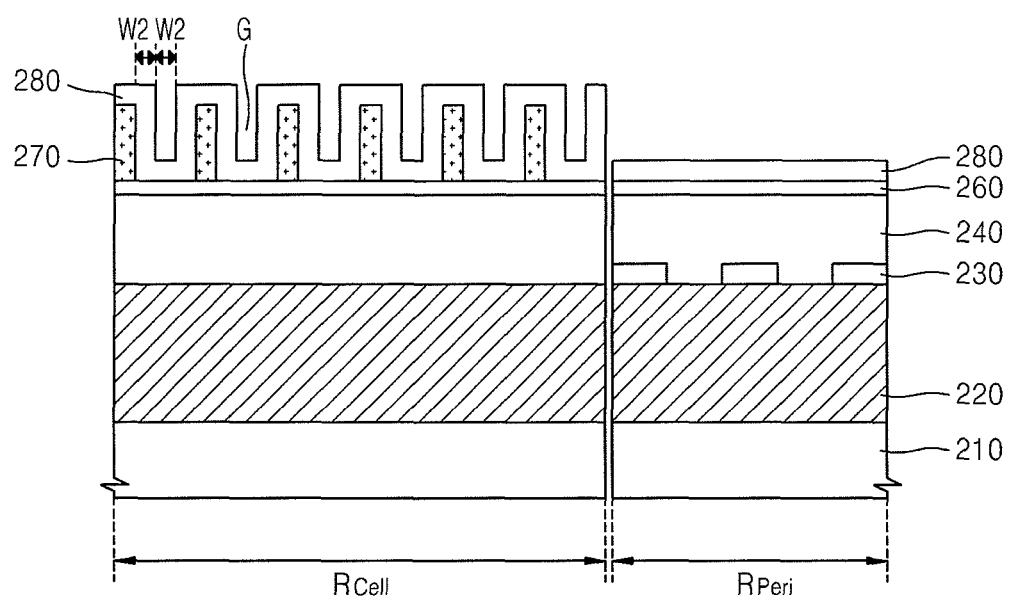

Referring to FIGS. 15A and 15B, a spacer layer 280 may be formed to cover photoresist patterns 270 and exposed anti-reflective layer 260. Spacer layer 280 may be an atomic layer deposition layer formed using an atomic layer deposition process, for example. Spacer layer 280 may have a thickness corresponding to second width W2, and a groove G having second width W2 may be formed in the interval between line-type patterns. In the peripheral region $R_{Peri}$, because the entire top surface of anti-reflective layer 260 is exposed, spacer layer 280 may be formed on the entire top surface of anti-reflective layer 260.

Figure 16A:
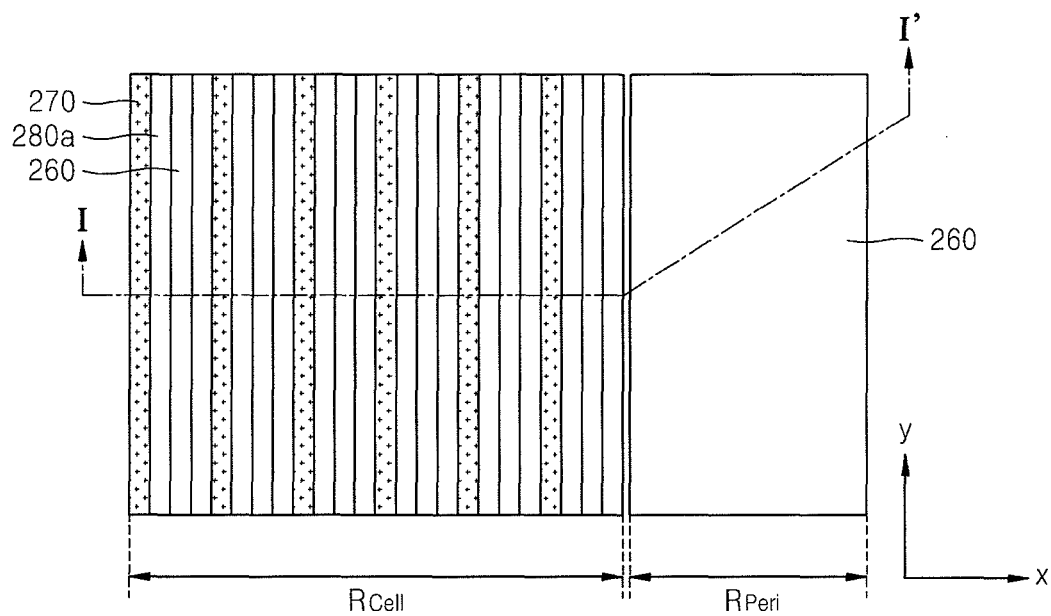
Figure 16B:
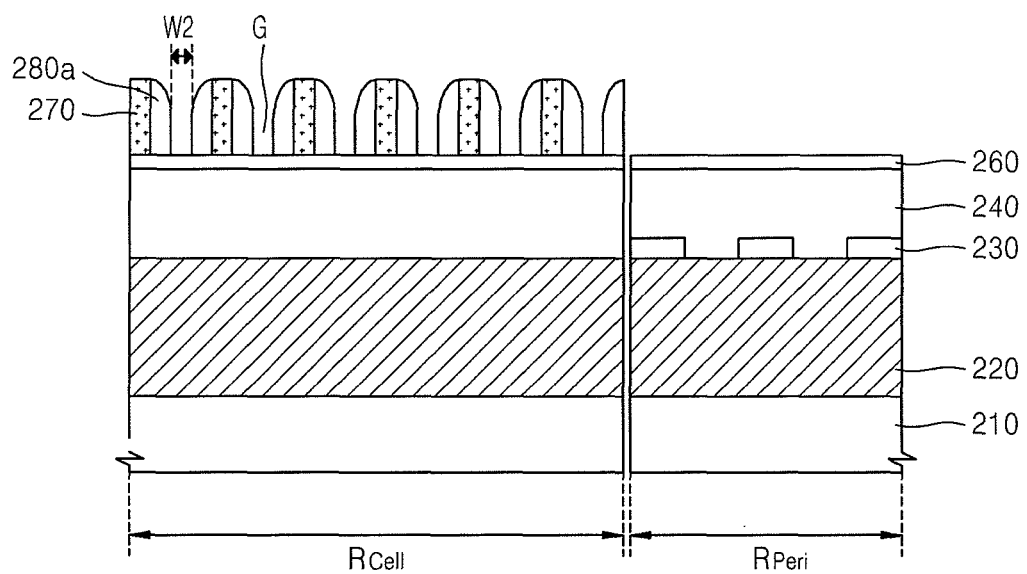

Referring to FIGS. 16A and 16B, spacer layer 280 may be etched back until photoresist patterns 270 are exposed, thereby forming spacers 280a on sidewalls of photoresist patterns 270. A bottom surface of groove G may be etched during the formation of spacers 280a, so that anti-reflective layer 260 can be exposed through groove G. In an exemplary embodiment in accordance with principles of inventive concepts an interval between spacers 280a may be equal to second width W2 corresponding to the width of groove G. In peripheral region $R_{Peri}$, spacer layer 280 may be wholly removed using an etchback process, thereby exposing the entire top surface of anti-reflective layer 260.

Figure 17A:
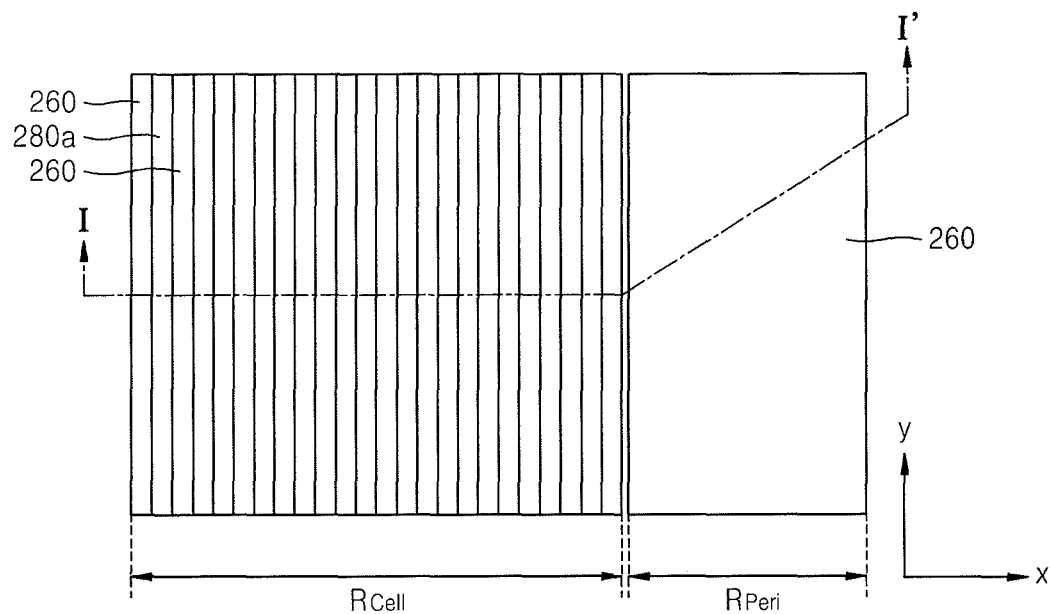
Figure 17B:
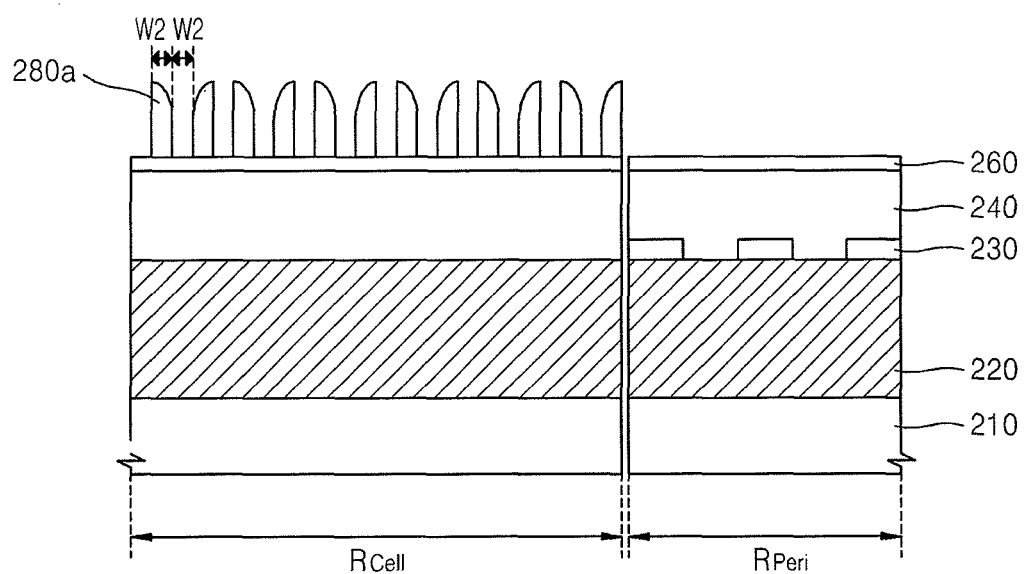

Referring to FIGS. 17A and 17B, photoresist patterns 270 may be removed to leave only spacers 280a on anti-reflective layer 260. In accordance with principles of inventive concepts, photoresist patterns 270 may be removed using ashing and stripping processes, a dry etching process, or a wet etching process, for example. After removing photoresist patterns 270, only spacers 280a may be left to a width corresponding to second width W2 at intervals corresponding to second width W2 on anti-reflective layer 260 of cell region $R_{Cell}$.

Figure 18A:
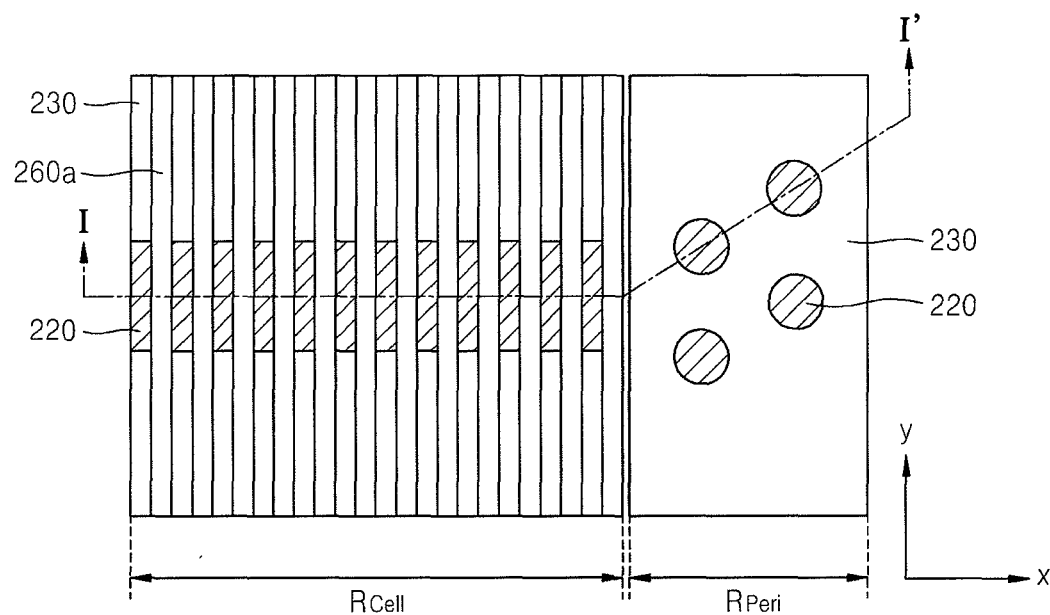
Figure 18B:
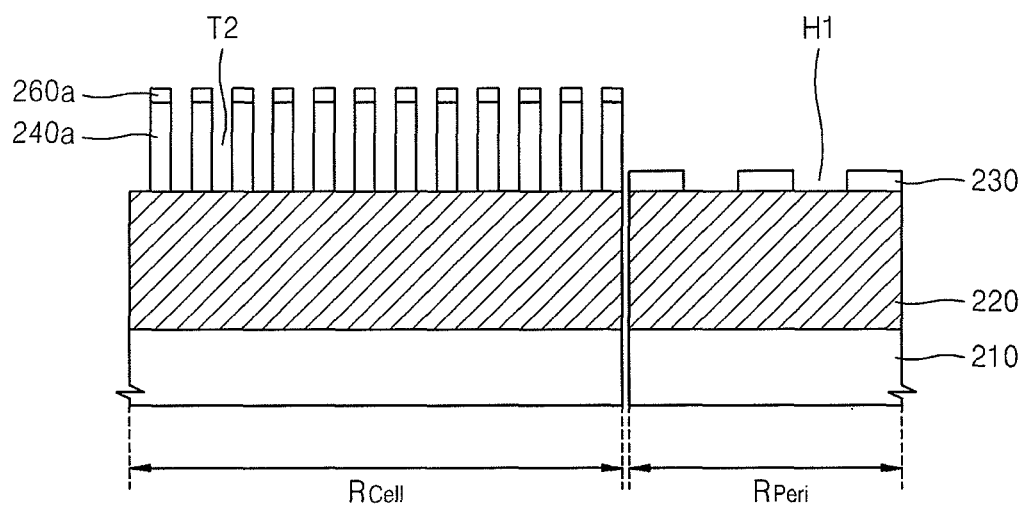

Referring to FIGS. 18A and 18B, anti-reflective layer 260 and first sacrificial layer 240 may be etched using spacers 280a as a mask, thereby forming an anti-reflective layer pattern 260a and a first sacrificial pattern 240a, which include a second opening T2. First mask pattern 230 and first insulating layer 220 may be exposed through second opening T2. Central portions of first insulating layer 220 may be alternately exposed in a first direction. As illustrated in exemplary embodiments in accordance with principles of inventive concepts depicted in FIGS. 3A and 3B, this is because only portions of first insulating layer 220 exposed by first openings T1 are exposed by second openings T2. That is, first insulating layer 220 may be exposed in portions where first and second openings T1 and T2 overlap each other.

Because no spacers are formed in peripheral region $R_{Peri}$, anti-reflective layer 260 and the first sacrificial layer 240 may be wholly removed, thereby exposing first insulating layer 220 through first mask pattern 230 and first holes H1.

Subsequent process steps may be the same as, or equivalent to, those described with reference to FIGS. 11A through 12C. That is, first insulating layer 220 may be etched using anti-reflective layer pattern 260a, first sacrificial pattern 240a, and first mask pattern 230 as an etch mask, thereby forming contact holes, and contact holes may be filled with a metal material, thereby forming metal contacts.

Figure 19:
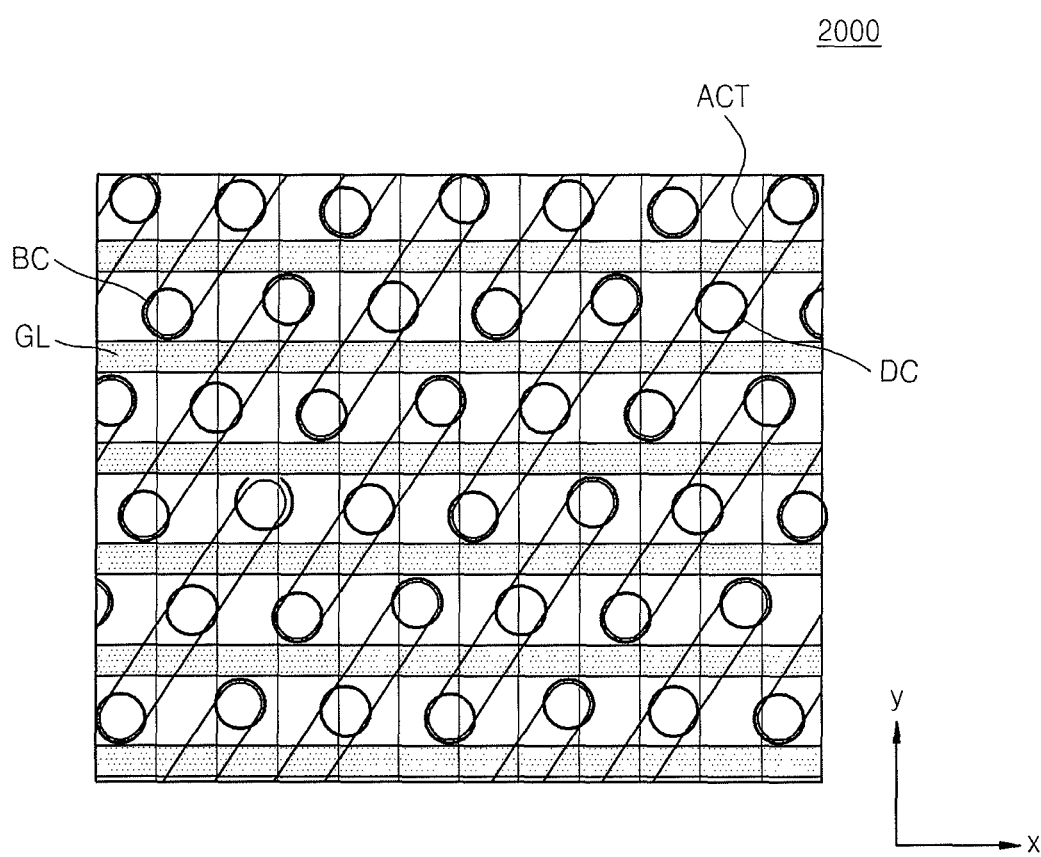
FIG. 19 illustrates the layout of a semiconductor device including a metal contact according to an exemplary embodiment in accordance with principles of inventive concepts.

FIG. 19 is a layout illustrating a semiconductor device 2000 (such as, for example, a dynamic random access memory (DRAM) device) including a metal contact according to an exemplary embodiment in accordance with principles of inventive concepts.

Referring to FIG. 19, semiconductor device 2000 may include active regions ACT defined by an isolation layer (not shown) and various contacts (for example, a direct contact (DC) and a buried contact (BC)) formed with him active regions ACT.

With a reduction in the design rule of semiconductor devices, active regions ACT may be disposed as diagonal or oblique bars. That is, active regions ACT may form a predetermined angle of less than 90° with respect to gate lines GL extending in an x direction in semiconductor device 2000.

As previously described, contacts may include direct contacts and buried contacts. A direct contact refers to a contact configured to contact active region ACT to a bit line, while a buried contact refers to a contact configured to connect active region ACT to a lower electrode (not shown) of a capacitor (in a DRAM embodiment). In semiconductor device 2000 of the present embodiment, the direct contacts may be disposed in the center of active region ACT, while the buried contacts may be disposed at either end thereof, for example.

Gate lines GL may be buried in a substrate of semiconductor device 1000 and formed across active region ACT between the direct contact and buried contact. In an exemplary embodiment in accordance with principles of inventive concepts, two gate lines GL may be formed across one active region ACT, and active region ACT and gate line GL may form a predetermined angle of less than 90° with respect to each other.

Direct contacts and buried contacts may not be disposed in straight lines along x and y directions. When direct contacts and buried contacts are not disposed in straight lines along x and y directions, a patterning process for forming contacts may otherwise be precluded due to downscaling of semiconductor devices. However, in accordance with principles of inventive concepts, direct contacts and buried contacts that are not disposed in straight lines may be easily formed using a double patterning technology process. An exemplary embodiment of such a process in accordance with principles of inventive concepts will be described with reference to FIG. 20.

Figure 20:
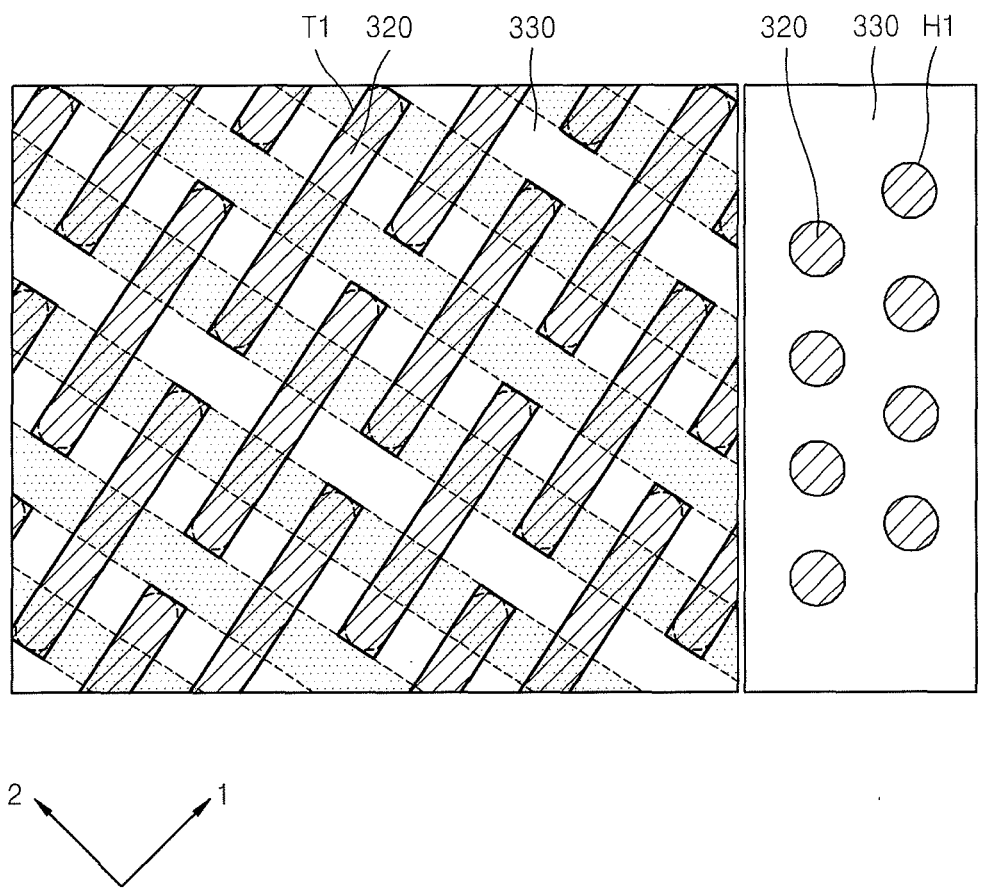
FIG. 20 is a plan view illustrating a method of forming a metal contact using a double patterning technology process in the semiconductor device of FIG. 19.

FIG. 20 is a plan view illustrating a method of forming a metal contact in the semiconductor device 2000 of FIG. 19 using a double patterning technology process, according to an exemplary embodiment in accordance with principles of inventive concepts.

Referring to FIG. 20, in semiconductor device 200 having the structure of FIG. 19 (for example, a DRAM memory device), a first insulating layer 320 and a first mask pattern 330 may be formed in the same manner as described with reference to FIGS. 3A through 3C, for example. First mask pattern 330 may include line-type first openings T1 extending in a first direction (a 1-direction) in cell region $R_{Cell}$ and first holes H1 formed in peripheral region $R_{Peri}$.

The first direction in which first openings T1 extend may be a direction in which an active region extends, and first openings T1 may expose portions (illustrated with dotted lines in rectangle) of first insulating layer 320, corresponding to the active region. The first direction may form a predetermined angle with a direction (for example, x direction) in which gate lines of FIG. 19 extend.

After forming first mask pattern 330, a first sacrificial pattern may be formed using double patterning technology process, such as described with reference to FIGS. 4B through 10C or FIGS. 13A through 18B, for example, and first insulating layer 320 may be etched using first mask pattern 330 and first sacrificial pattern as a mask, thereby forming a metal contact contacting the active region. An initially formed line-and-space pattern in the double patterning technology process may be formed in a second direction (a 2-direction) perpendicular to the first direction as illustrated with dotted lines in FIG. 20. Additionally, two first sacrificial patterns (illustrated with hatched lines) may be formed across each of active regions so that a single buried contact (BC) and two direct contact (DC) may be formed in each of the active regions.

Although a method of fabricating a metal contact using a double patterning technology process in a flash memory device and a DRAM memory device is described thus far, the method of fabrication the metal contact using the double patterning technology process is not limited to a flash memory device or a DRAM memory device. That is, the method of fabricating metal contact using a double patterning technology process according to principles of inventive concepts may be applied to various semiconductor devices. For example, various metal contacts of system large-scale integrations (LSIs) may be formed using a double patterning technology process in accordance with principles of inventive concepts.

Figure 21:
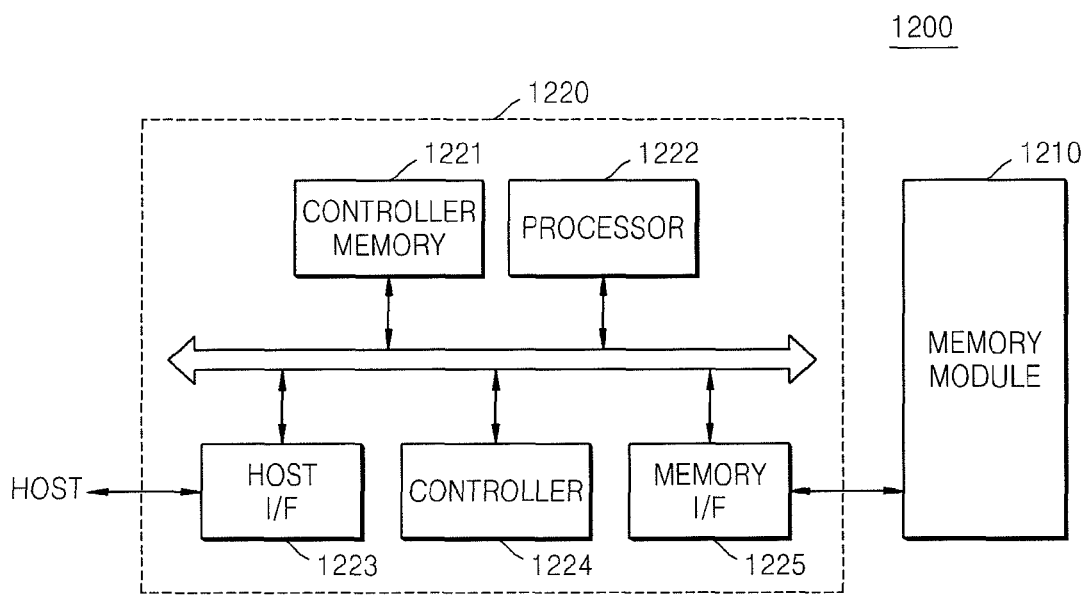
FIG. 21 is a block diagram of a memory card including a semiconductor device formed according to an exemplary embodiment in accordance with principles of inventive concepts.

FIG. 21 is a block diagram of a memory card 1200 including a semiconductor device fabricated according to principles of inventive concepts. Memory card 1200 may include a memory controller 1220 configured to generate command and address signals C/A and a memory module 1210. Memory module 1210 may include, for example, at least one flash memory device. Memory controller 1220 may include a host interface 1223 and a memory interface 1225. Host interface 1223 may transmit command and address signals C/A to a host or receive the command and address signals from a host. Memory interface 1225 may transmit command and address signals C/A or receive command and address signals C/A from memory module 1210. Host interface 1223, a controller 1224, and memory interface 1225 may communicate with controller memory 1221, such as a static random access memory (SRAM), and a processor 1222, such as a central processing unit (CPU), through a common bus.

Memory module 1210 may receive command and address signals C/A from memory controller 1220 and store data in at least one memory device of memory module 1210 or read data from at least one memory device in response to command and address signals C/A. Each of the memory devices may include a plurality of memory cells and a decoder configured to receive command and address signals C/A and to generate row and address signals to access at least one addressable memory cell during program and read operations. Each component of memory card 1200, for example, each of electronic devices 1221, 1222, 1223, 1224, and 1225 included in memory controller 1220 and memory module 1210 may include a metal contact formed using a double patterning technology process according to principles of inventive concepts.

Figure 22:
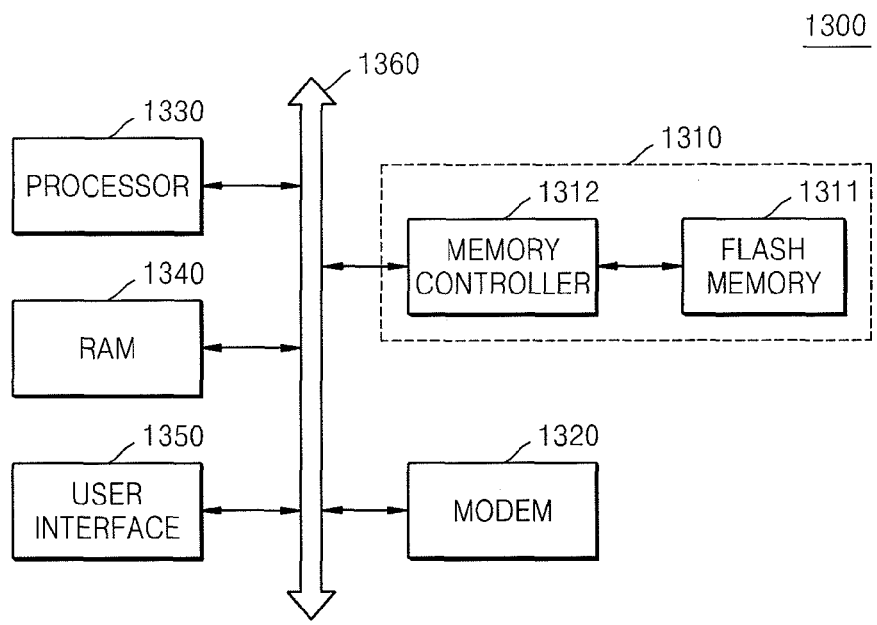
FIG. 22 is a block diagram of a memory system, using a memory card including a semiconductor device in accordance with exemplary embodiments of inventive concepts.

FIG. 22 is a block diagram of a memory system 1300 that includes a memory card that includes a semiconductor device in accordance with principles of inventive concepts. Memory system 1300 may include a processor 1330, such as a CPU, a random access memory (RAM) 1340, a user interface 1350, and a modem 1320, which may communicate with one another through a common bus 1360. Each component of memory system 1300 may transmit signals to a memory card 1310 through common bus 1360 and receive signals from memory card 1310. Each of the components of memory system 1300, including not only memory card 1310 but also processor 1330, RAM 1340, user interface 1350, and modem 1320, may include a metal contact formed using a double patterning technology process in accordance with principles of inventive concepts. Memory system 1300 may be employed in various electronic fields. For example, memory system 1300 may be applied to solid-state drives (SSD), complementary metal-oxide-semiconductor (CMOS) image sensors, or computer application chipsets.

Memory systems and devices in accordance with principles of inventive concepts may be packaged using one of various package technologies including, for example, ball-grid-array (BGA) packages, chip-scale packages (CSPs), plastic leaded chip carriers (PLCCs), plastic dual in-line packages (PDIPs), multichip packages (MCPs), wafer-level fabricated packages (WFPs), and wafer-level processed stock packages (WSPs).

In a method of fabricating a metal contact using a double patterning technology process in accordance with principles of inventive concepts, the metal contact may be formed using a double patterning technology process in a string overhead area between two string selection lines, thereby greatly reducing the string overhead area. In other words, the size of the string overhead area can be sharply reduced according to a second-directional width of the metal contact formed using a double patterning technology process in accordance with principles of inventive concepts. With the reduction in the size of the string overhead area, the entire size of a semiconductor device can be greatly reduced.

Additionally, because a metal contact of a peripheral region can be formed at the same time as a metal contact of a cell region, a metal contact forming process of the entire semiconductor fabrication process can be simplified.

Although embodiments in accordance with principles of inventive concepts have been particularly shown and described, it will be appreciated by those skilled in the art that changes may be made in these embodiments without departing from the principles and spirit of inventive concepts, the scope of which is defined in the appended claims and their equivalents.

What is claimed is:

1. A method of fabricating a metal contact, comprising:
sequentially forming a first insulating layer and a first mask layer on a target layer in which a cell region and a peripheral region are defined;
forming a first mask pattern by etching the first mask layer, the first mask pattern including a first opening formed in the cell region and a first hole formed in the peripheral region, the first opening having a rectangular shape which extends in a first direction and exposing the first insulating layer, the first hole exposing the first insulating layer;
forming a first sacrificial pattern on the first mask pattern and the exposed first insulating layer of the cell region using a double patterning technology process, the first sacrificial pattern having a rectangular shape extending in a second direction perpendicular to the first direction;
forming contact holes exposing the target layer by etching the first insulating layer using the first mask pattern and the first sacrificial pattern as an etch mask; and
forming a metal contact by filling the contact holes with a metal material.

2. The method of claim 1, wherein the forming of the first sacrificial pattern comprises:
forming a first sacrificial layer to cover the first mask pattern and the exposed first insulating layer;
sequentially forming a second sacrificial layer and an anti-reflection layer on the first sacrificial layer;
forming a photoresist pattern on the anti-reflective layer of the cell region, the photoresist pattern having a rectangular shape extending in the second direction;
forming a second opening exposing the first sacrificial layer by etching the anti-reflective layer and the second sacrificial layer using the photoresist pattern as an etch mask;
forming spacers on sidewalls of the second opening;

removing the second sacrificial layer; and
completing the first sacrificial pattern including a third opening exposing the first mask pattern by etching the first sacrificial layer using the spacers as an etch mask.

3. The method of claim 2, wherein the forming of the photoresist pattern is performed without forming the photoresist pattern in the peripheral region, the completing of the first sacrificial pattern comprises exposing the first mask pattern of the peripheral region, and the forming of the contact holes comprises forming a contact hole defined by the first opening and corresponding to the first sacrificial pattern in the cell region and forming a contact hole corresponding to the first hole in the peripheral region.

4. The method of claim 2, wherein a first-directional width of the photoresist pattern is a first width, and an interval between lines of the photoresist pattern is three times the first width, and after removing the second sacrificial layer, the first-directional width of the spacers is equal to the first width, and an interval between the spacers is equal to the first width.

5. The method of claim 2, wherein the forming of the spacers comprises:
    forming a spacer layer to cover the anti-reflective layer, the second sacrificial layer, and the exposed first sacrificial layer; and
    completing the spacers by etching back the spacer layer until the second sacrificial layer is exposed.

6. The method of claim 2, wherein the first insulating layer is formed of an oxide material, the first mask layer is formed of a nitride material, the first sacrificial layer is formed of polysilicon (poly-Si), the second sacrificial layer is formed of a spin-on hard mask (SOH), and the anti-reflective layer is formed of a silicon oxynitride (SiON) material.

7. The method of claim 1, wherein the forming of the first sacrificial pattern comprises:
    forming a first sacrificial layer to cover the first mask pattern and the exposed first insulating layer;
    forming an anti-reflective layer on the first sacrificial layer;
    forming a photoresist pattern on the anti-reflective layer of the cell region, the photoresist pattern having a rectangular shape extending in the second direction;
    forming spacers on sidewalls of the photoresist pattern;
    removing the photoresist pattern; and
    completing the first sacrificial pattern including a second opening exposing the first mask pattern by etching the first sacrificial layer using the spacers as an etch mask.

8. The method of claim 7, wherein the forming of the photoresist pattern is performed without forming the photoresist pattern in the peripheral region,
    the completing of the first sacrificial pattern comprises exposing the first mask pattern of the peripheral region,
    and the forming of the contact holes comprises forming a contact hole defined by the first opening and corresponding to the first sacrificial pattern in the cell region and forming a contact hole corresponding to the first hole in the peripheral region.

9. The method of claim 1, wherein the metal contact is formed in at least one of a flash memory device, a dynamic random access memory (DRAM) memory device, and a system large-scale integration (system LSI).

10. The method of claim 9, wherein when the metal contact is formed in the flash memory device, the metal contact is formed in a string overhead area corresponding to a region between two adjacent string selection lines of the flash memory device, and the second-directional width of the string overhead area is determined by the second-directional width of the first opening.

11. The method of claim 9, wherein when the metal contact is formed in the DRAM memory device, an active region is defined as a bar type by an isolation layer in the target layer along the first direction, wherein gate lines are formed at a predetermined angle to the first direction, the first opening is formed in a portion corresponding to the active region, and at least three contact holes are formed in a portion defined by the first opening.

12. A method of fabricating a metal contact using double patterning technology, the method comprising:
    forming a first insulating layer on a target layer in which a cell region and a peripheral region are defined;
    forming a mask pattern on the first insulating layer, the mask pattern including a first opening formed in a string overhead area between two adjacent string selection lines of the cell region and a first hole formed in the peripheral region;
    forming a first sacrificial pattern having a line-&-space shape on the mask pattern of the cell region using a double patterning technology process;
    forming a first contact hole in the string overhead area of the cell region and forming a second contact hole in the peripheral region by etching the first insulating layer using the mask pattern and the first sacrificial pattern as a mask, the first contact hole defined by the first opening and corresponding to the first sacrificial pattern, the second contact hole corresponding to the first hole; and
    forming a metal contact connected to the target layer of the cell region and the peripheral region by filling the first and second contact holes with a metal material.

13. The method of claim 12, wherein the first opening has a rectangular shape in a first direction in which the string selection lines extend,
    wherein the forming of the first sacrificial pattern comprises:
    forming a first sacrificial layer to cover the mask pattern and the exposed first insulating layer;
    sequentially forming a second sacrificial layer and an anti-reflective layer on the first sacrificial layer;
    forming a photoresist pattern on the anti-reflective layer of the cell region, the photoresist pattern having a line-&-space shape extending in a second direction perpendicular to the first direct direction;
    forming a second opening exposing the first sacrificial layer by etching the anti-reflective layer and the second sacrificial layer using the photoresist pattern as a mask;
    forming spacers on sidewalls of the second opening;
    removing the second sacrificial layer; and
    completing the first sacrificial pattern including a third opening exposing the mask pattern by etching the first sacrificial layer using the spacers as a mask.

14. The method of claim 12, wherein the first opening has a rectangular shape along a first direction in which the string selection lines extend,
    wherein the forming of the first sacrificial pattern comprises:
    forming a first sacrificial layer to cover the first mask layer and the exposed first insulating layer;
    forming an anti-reflective layer on the first sacrificial layer;
    forming a photoresist pattern on the anti-reflective layer of the cell region, the photoresist pattern having a line-&-space shape extending in a second direction perpendicular to the first direction;
    forming spacers on sidewalls of the photoresist pattern;
    removing the photoresist pattern; and completing the first sacrificial pattern including a second opening exposing the mask pattern by etching the anti-reflective layer and the first sacrificial layer using the spacers as a mask.

15. The method of claim 12, wherein the string selection lines are string selection lines formed in a cell region of a flash memory device, wherein a second-directional width of the string overhead area is determined by a second-directional width of the first opening, and a second direction is perpendicular to a first direction.

* * * * *